United States Patent
Yasuda et al.

(10) Patent No.: US 8,034,190 B2
(45) Date of Patent: Oct. 11, 2011

(54) SUBSTRATE PROCESSING APPARATUS AND SUBSTRATE PROCESSING METHOD

(75) Inventors: Shuichi Yasuda, Kyoto (JP); Masashi Kanaoka, Kyoto (JP); Koji Kaneyama, Kyoto (JP); Tadashi Miyagi, Kyoto (JP); Kasuhito Shigemori, Kyoto (JP); Toru Asano, Kyoto (JP); Akihiro Hisai, Kyoto (JP); Hiroshi Kobayashi, Kyoto (JP); Tsuyoshi Okumura, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 0 days.

(21) Appl. No.: 12/719,788

(22) Filed: Mar. 8, 2010

(65) Prior Publication Data

US 2010/0159142 A1   Jun. 24, 2010

Related U.S. Application Data

(62) Division of application No. 11/273,463, filed on Nov. 10, 2005, now abandoned.

(30) Foreign Application Priority Data

| Nov. 10, 2004 | (JP) | ................................ 2004-326307 |
| Mar. 29, 2005 | (JP) | ................................ 2005-095785 |
| Sep. 14, 2005 | (JP) | ................................ 2005-267332 |

(51) Int. Cl.
*B08B 3/00* (2006.01)
*G03F 7/00* (2006.01)
*H01L 21/00* (2006.01)

(52) U.S. Cl. ............ 134/26; 134/32; 430/311; 438/906; 438/908

(58) Field of Classification Search .................... 134/26, 134/32; 430/311; 438/906, 908
See application file for complete search history.

(56) References Cited

U.S. PATENT DOCUMENTS

| 6,454,472 | B1 | 9/2002 | Kim et al. |
| 6,558,053 | B2 | 5/2003 | Shigemori et al. |
| 6,873,938 | B1 * | 3/2005 | Paxton et al. .................. 702/188 |
| 6,893,171 | B2 | 5/2005 | Fukutomi et al. |
| 7,364,626 | B2 | 4/2008 | Hirose et al. |
| 7,497,633 | B2 | 3/2009 | Kaneyama et al. |

(Continued)

FOREIGN PATENT DOCUMENTS

CN   1385882 A   12/2002

(Continued)

OTHER PUBLICATIONS

Office Action of Chinese Application No. 200510120446.9, mailed dated Jul. 24, 2009, 6 pages.

(Continued)

*Primary Examiner* — Michael Kornakov
*Assistant Examiner* — Nicole Blan
(74) *Attorney, Agent, or Firm* — Kilpatrick Townsend & Stockton LLP

(57) ABSTRACT

A substrate processing apparatus comprises an indexer block, an anti-reflection film processing block, a resist film processing block, a development processing block, and an interface block. An exposure device is arranged adjacent to the interface block. The interface block comprises washing processing units and an interface transport mechanism. Before a substrate is subjected to exposure processing by the exposure device, the substrate is transported to a washing processing unit by the interface transport mechanism. The substrate is washed and dried by the washing processing unit.

17 Claims, 14 Drawing Sheets

U.S. PATENT DOCUMENTS

| | | |
|---|---|---|
| 7,658,560 B2 | 2/2010 | Kaneyama |
| 7,665,916 B2 | 2/2010 | Yamamoto et al. |
| 2002/0029788 A1* | 3/2002 | Verhaverbeke et al. ....... 134/1.3 |
| 2002/0098458 A1 | 7/2002 | Hashimoto |
| 2002/0160625 A1* | 10/2002 | Inoue et al. .................. 438/780 |
| 2003/0045131 A1* | 3/2003 | Verbeke et al. ............... 438/795 |
| 2003/0213431 A1* | 11/2003 | Fukutomi et al. ............. 118/696 |
| 2003/0226577 A1* | 12/2003 | Orll et al. ........................ 134/1.3 |
| 2004/0005149 A1 | 1/2004 | Sugimoto et al. |
| 2004/0118814 A1* | 6/2004 | Kim et al. ........................ 216/96 |
| 2004/0182318 A1 | 9/2004 | Hashinoki et al. |
| 2005/0069819 A1 | 3/2005 | Shiobara |
| 2005/0075819 A1* | 4/2005 | Paxton et al. ................ 702/117 |
| 2005/0221234 A1* | 10/2005 | Ito ................................ 430/322 |
| 2005/0287821 A1 | 12/2005 | Higashi et al. |
| 2006/0017903 A1* | 1/2006 | Bleeker et al. .................. 355/67 |
| 2006/0061747 A1 | 3/2006 | Ishii |
| 2006/0098979 A1 | 5/2006 | Kaneyama et al. |
| 2006/0104635 A1 | 5/2006 | Kaneyama et al. |
| 2006/0152698 A1 | 7/2006 | Ishii |
| 2008/0020315 A1 | 1/2008 | Higashi et al. |

FOREIGN PATENT DOCUMENTS

| | | | |
|---|---|---|---|
| CN | 1926662 A | | 3/2007 |
| JP | 06-151293 A | | 5/1994 |
| JP | 08-314156 A | | 11/1996 |
| JP | 10-041261 A | | 2/1998 |
| JP | 11-233480 A | | 8/1999 |
| JP | 2002-217267 A | | 8/2002 |
| JP | 2002-273360 A | | 9/2002 |
| JP | 3337677 B2 | | 10/2002 |
| JP | 2003-092283 A | | 3/2003 |
| JP | 2003-324139 A | | 11/2003 |
| JP | 2004-015023 A | | 1/2004 |
| JP | 2004-087795 A | | 3/2004 |
| JP | 2004-193597 A | | 7/2004 |
| JP | 2004-319767 A | | 11/2004 |
| JP | 2005-109146 A | | 4/2005 |
| JP | 2005-197469 A | | 7/2005 |
| JP | 2005-294520 A | | 10/2005 |
| JP | 2006-024684 A | | 1/2006 |
| WO | WO 99/49504 A | | 9/1999 |
| WO | WO 2004/053956 A | | 6/2004 |
| WO | WO 2004/053959 | | 6/2004 |
| WO | WO 2004053959 A1 * | | 6/2004 |
| WO | WO 2004/102646 A1 | | 11/2004 |

OTHER PUBLICATIONS

Office Action of Chinese Application No. 200510120446.9, mailed dated Apr. 2, 2010, 7 pages.

U.S. Appl. No. 12/754,872, filed Apr. 6, 2010; first named inventor: Koji Kaneyama.

Office Action of Chinese Application No. 200510120446.9, mailed Aug. 12, 2010, 9 pages total. [No English Translation].

Office Action in the counterpart Japanese Application No. 2005-267332, dated Mar. 1, 2011. 3 pages.

Office Action in the counterpart Japanese Application No. 2005-267332 dated May 31, 2011, 3 pages.

* cited by examiner (a)

(b)

(c)

F I G. 6
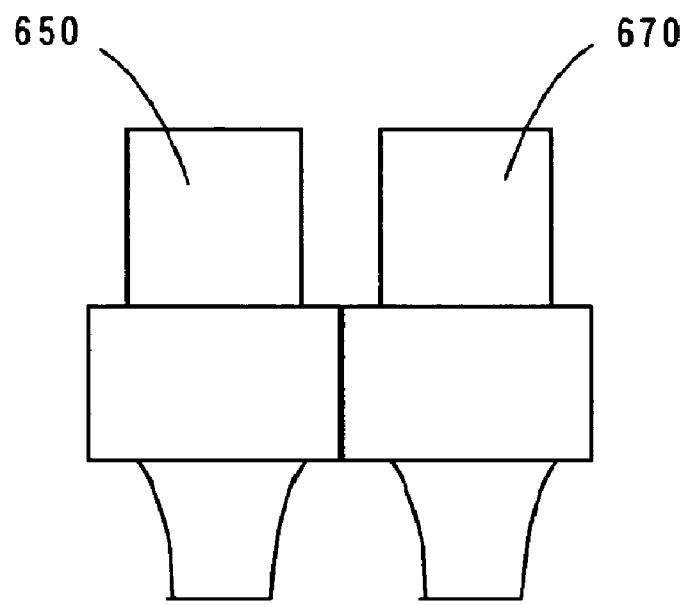

F I G. 7
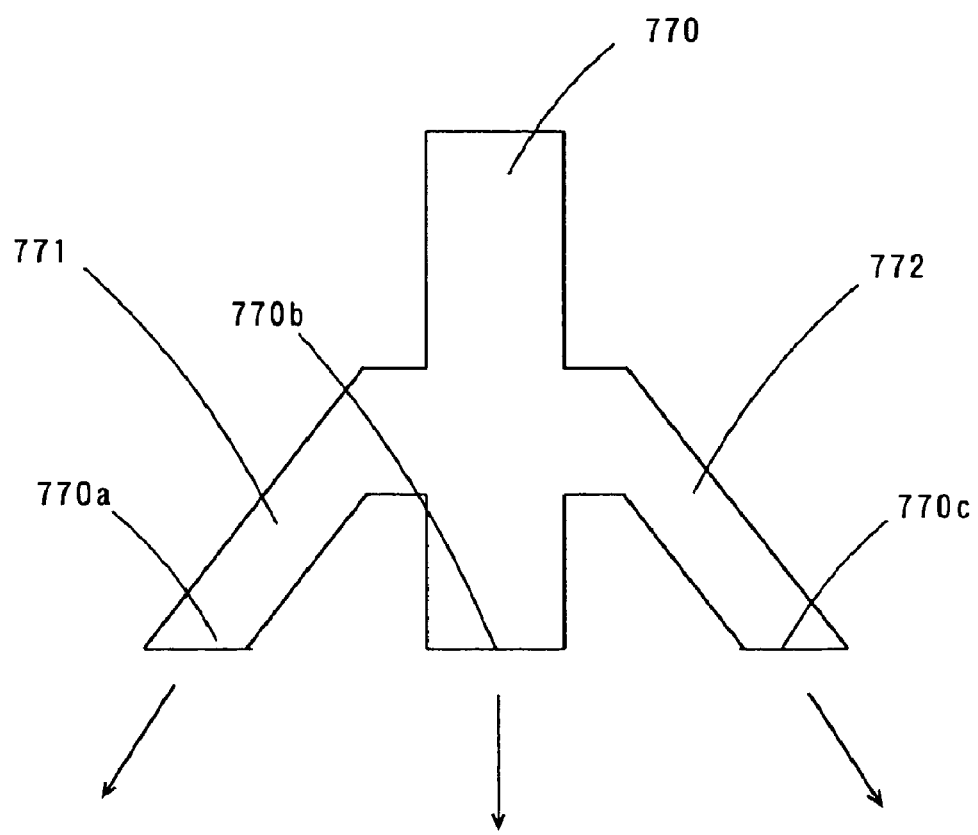

(a)

(b)

(c)

F I G. 9
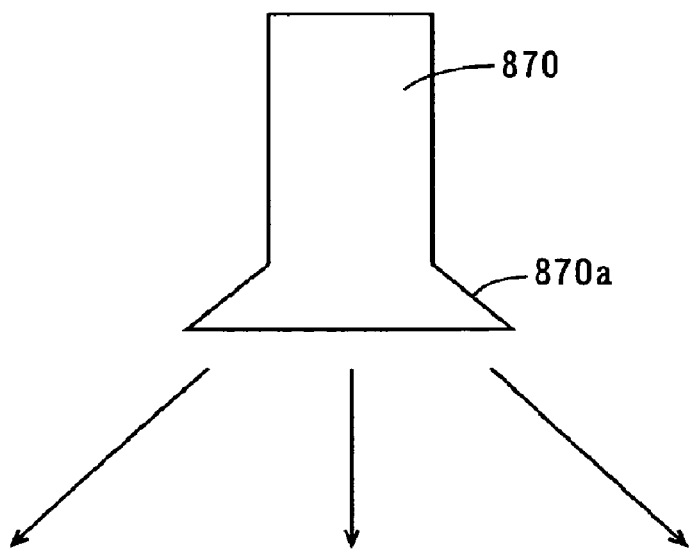

(a)

(b)

(c)

SUBSTRATE PROCESSING APPARATUS AND SUBSTRATE PROCESSING METHOD

CROSS-REFERENCES TO RELATED APPLICATIONS

This application is a division of U.S. patent application Ser. No. 11/273,463, filed Nov. 10, 2005, which claims priority to Japanese Patent Application Nos. 2004-326307, 2005-95785, 2005-267332, the disclosures of which are hereby incorporated by reference in their entirety.

BACKGROUND OF THE INVENTION

1. Field of the Invention

The present invention relates to a substrate processing apparatus and a substrate processing method for applying processing to substrates.

2. Description of the Background Art

A substrate processing apparatus is used to apply a variety of processings to substrates such as semiconductor substrates, substrates for use in liquid crystal displays, plasma displays, optical disks, magnetic disks, magneto-optical disks, photomasks, and other substrates.

Such a substrate processing apparatus typically applies a plurality of successive processings to a single substrate. The substrate processing apparatus as described in JP 2003-324139 A comprises an indexer block, an anti-reflection film processing block, a resist film processing block, a development processing block, and an interface block. An exposure device is arranged adjacent to the interface block as an external device separate from the substrate processing apparatus.

In the above-described substrate processing apparatus, a substrate is carried from the indexer block into the anti-reflection film processing block and the resist film processing block, where the formation of an anti-reflection film and resist film coating processing are applied to the substrate. The substrate is then transported to the exposure device through the interface block. After exposure processing has been applied to the resist film on the substrate by the exposure device, the substrate is transported to the development processing block through the interface block. In the development processing block, development processing is applied to the resist film on the substrate to form a resist pattern thereon, and the substrate is subsequently carried into the indexer block.

With recent improvements in the density and integration of devices, making finer resist patterns have become very important. Conventional exposure devices typically perform exposure processing by providing reduction projection of a reticle pattern on a substrate through a projection lens. With such conventional exposure devices, however, the line width of an exposure pattern is determined by the wavelength of the light source of an exposure device, thus making it impossible to make a resist pattern finer than that.

For this reason, a liquid immersion method is suggested as a projection exposure method allowing for finer exposure patterns (refer to, e.g., WO99/49504 pamphlet). In the projection exposure device according to the WO99/49504 pamphlet, a liquid is filled between a projection optical system and a substrate, resulting in a shorter wavelength of exposure light on a surface of the substrate. This allows for a finer exposure pattern.

However, in the projection exposure device according to the aforementioned WO99/49504 pamphlet, exposure processing is performed with the substrate and the liquid being in contact with each other. Accordingly, part of the component of a resist applied on the substrate is eluted in the liquid. The resist component eluted in the liquid remains on a surface of the substrate, which may become the cause of a defect.

The resist component eluted in the liquid contaminates the lens of the exposure device. This may cause a defective dimension and a defective shape of the exposure pattern.

SUMMARY OF THE INVENTION

It is an object of the invention to provide a substrate processing apparatus and a substrate processing method capable of preventing a component of a processing liquid on a substrate from being eluted in a liquid in an exposure device.

(1) A substrate processing apparatus according to one aspect of the invention that is arranged adjacent to an exposure device comprises a processing section for applying processing to a substrate, and an interface for exchanging the substrate between the processing section and the exposure device, wherein the processing section includes a first processing unit that applies a processing liquid to the substrate, and the interface includes a second processing unit that washes the substrate before exposure processing by the exposure device and a transport device that transports the substrate between the processing section, the exposure device, and the second processing unit.

In the substrate processing apparatus, the processing liquid is applied to the substrate by the first processing unit, and then the substrate is transported to the second processing unit by the transport device. The substrate is washed by the second processing unit, and then transported to the exposure device by the transport device. The substrate is subjected to the exposure processing by the exposure device, and subsequently transported to the processing section by the transport device.

In this way, the substrate is washed by the second processing unit before the exposure processing by the exposure device. Part of the component of the processing liquid applied on the substrate by the first processing unit is thus eluted, and washed away. In this case, even if the substrate in contact with a liquid is subjected to the exposure processing by the exposure device, the component of the processing liquid on the substrate is hardly eluted. This reduces contamination of the lens and the like of the exposure device while preventing the component of the processing liquid from remaining on a surface of the substrate. As a result, processing defects in the substrate that may be generated in the exposure device can be reduced.

(2) The first processing unit may apply a resist liquid to the substrate as the processing liquid. In this case, part of the component of a resist on the substrate is eluted in the second processing unit, and washed away. Therefore, even if the substrate in contact with a liquid is subjected to the exposure processing, the resist component is hardly eluted. As a result, contamination of the lens and the like of the exposure device is reduced while the resist component is prevented from remaining on the surface of the substrate.

(3) The interface may further include a third processing unit that applies given processing to the substrate and a platform on which the substrate is temporarily mounted, and the transport device may include a first transport unit that transports the substrate between the processing section, the third processing unit, and the platform, and a second transport unit that transports the substrate between the platform, the second processing unit and the exposure device, and wherein the second transport unit may transport the substrate from the platform to the second processing unit.

In this case, after the processing liquid has been applied to the substrate by the first processing unit, the substrate is transported to the third processing unit by the first transport unit. The substrate is subjected to the given processing by the third processing unit, and then transported to the platform by the first transport unit. After this, the substrate is transported to the second processing unit from the platform by the second transport unit. The substrate is washed by the second processing unit, and then transported to the exposure device by the second transport unit.

In this way, the substrate is washed by the second processing unit before the exposure processing by the exposure device. Part of the component of the processing liquid applied on the substrate by the first processing unit is thus eluted, and washed away. In this case, even if the substrate in contact with a liquid is subjected to the exposure processing by the exposure device, the component of the processing liquid on the substrate is hardly eluted. This reduces contamination of the lens and the like of the exposure device while preventing the component of the processing liquid from remaining on the surface of the substrate. As a result, processing defects in the substrate that may be generated in the exposure device can be reduced.

(4) The third processing unit may include an edge exposure unit for subjecting a peripheral portion of the substrate to exposure. In this case, the peripheral portion of the substrate is subjected to the exposure processing by the edge exposure unit.

(5) The first transport unit may comprise first and second holders for holding the substrate, and wherein the first transport unit may hold the substrate with the first holder when transporting the substrate before the exposure processing by the exposure device and may hold the substrate with the second holder when transporting the substrate after the exposure processing by the exposure device, the second transport unit may comprise third and fourth holders for holding the substrate, and wherein the second transport unit may hold the substrate with the third holder when transporting the substrate before the exposure processing by the exposure device and may hold the substrate with the fourth holder when transporting the substrate after the exposure processing by the exposure device.

In this case, the first and third holders are used when transporting the substrate to which no liquid is attached before the exposure processing, while the second and fourth holders are used when transporting the substrate to which a liquid is attached after the exposure processing. This prevents a liquid from attaching to the first and third holders, so as to prevent the attachment of a liquid to the substrate before the exposure processing. This makes it possible to prevent the contamination of the substrate due to the attachment of particles and the like in the atmosphere. As a result, it is possible to prevent the generation of processing defects due to, e.g., degradation in the resolution performance of the exposure device.

(6) The second holder may be provided below the first holder, and the fourth holder may be provided below the third holder. This prevents a liquid that drops from the second and fourth holders and the substrate held thereon from attaching to the first and third holders and the substrates held thereon. This reliably prevents a liquid from attaching to the substrate before the exposure processing.

(7) The second processing unit may further dry the substrate after washing the substrate.

This prevents the attachment of particles and the like in the atmosphere to the washed substrate. Also, if the washing liquid remains on the washed substrate, the component of the processing liquid may be eluted in the residual washing liquid. Thus, by drying the washed substrate, it is possible to prevent the component of the processing liquid on the substrate from being eluted in the washing liquid remaining on the substrate. It is therefore possible to reliably prevent a defective shape of the film of the processing liquid that is applied on the substrate and the contamination inside the exposure device. As a result of the foregoing, processing defects of the substrate can be reliably prevented.

(8) The second processing unit may comprise a substrate holding device that holds the substrate substantially horizontally, a rotation-driving device that rotates the substrate held on the substrate holding device about an axis vertical to the substrate, a washing liquid supplier that supplies a washing liquid onto the substrate held on the substrate holding device, and an inert gas supplier that supplies an inert gas onto the substrate after the washing liquid has been supplied onto the substrate by the washing liquid supplier.

In the second processing unit, the substrate is held on the substrate holding device substantially horizontally, and the substrate is rotated about the axis vertical to the substrate by the rotation-driving device. Then, the washing liquid is supplied onto the substrate from the washing liquid supplier, followed by the supply of the inert gas from the inert gas supplier.

In this case, since the substrate is rotated as the washing liquid is supplied onto the substrate, the washing liquid on the substrate is constantly moved toward the peripheral portion of the substrate by the centrifugal force, and splashed away. It is thus possible to prevent the component of the processing liquid eluted in the washing liquid from remaining on the substrate. In addition, since the substrate is rotated as the inert gas is supplied onto the substrate, the washing liquid remaining on the substrate after the washing of the substrate is efficiently removed. This reliably prevents the component of the processing liquid from remaining on the substrate while drying the substrate reliably. During the transport of the washed substrate to the exposure device, therefore, it is possible to reliably prevent the component of the processing liquid on the substrate from being further eluted in the washing liquid remaining on the substrate. As a result, it is possible to reliably prevent a defective shape of the film of the processing liquid that is applied on the substrate and the contamination inside the exposure device.

(9) The inert gas supplier may supply the inert gas so that the washing liquid supplied onto the substrate from the washing liquid supplier is removed from the substrate as the washing liquid moves outwardly from the center of the substrate.

This prevents the washing liquid from remaining on the center of the substrate, which reliably prevents the generation of dry marks (dry stains) on the surface of the substrate. Also, during the transport of the washed substrate to the exposure device, it is possible to prevent the component of the processing liquid from being further eluted in the washing liquid remaining on the substrate. It is thus possible to prevent processing defects in the substrate more reliably.

(10) The second processing unit may further comprise a rinse liquid supplier that supplies a rinse liquid onto the substrate after the supply of the washing liquid from the washing liquid supplier and before the supply of the inert gas from the inert gas supplier.

This allows the washing liquid to be reliably washed away by the rinse liquid, making it possible to prevent the component of the processing liquid eluted in the washing liquid from remaining on the substrate more reliably.

(11) The inert gas supplier may supply the inert gas so that the rinse liquid supplied onto the substrate from the rinse liquid supplier is removed from the substrate as the rinse liquid moves outwardly from the center of the substrate. This prevents the rinse liquid from remaining on the center of the substrate, which prevents the generation of dry marks on the surface of the substrate reliably. Also, during the transport of the washed substrate to the exposure device, it is possible to reliably prevent the component of the processing liquid on the substrate from being further eluted in the rinse liquid remaining on the substrate. As a result of the foregoing, it is possible to prevent processing defects in the substrate more reliably.

(12) The second processing unit may wash the substrate by supplying a fluid mixture containing a washing liquid and a gas onto the substrate from a fluid nozzle.

Since the fluid mixture discharged from the fluid nozzle contains fine droplets, any contaminants attached on the surface of the substrate are stripped off, even if the surface has irregularities. Moreover, even if the film on the substrate has low wettability, the fine droplets strip off the contaminants on the substrate surface, so that the contaminants can be reliably removed from the substrate surface.

Consequently, even if the solvent or the like in the film on the substrate is sublimated and the sublimates are attached to the substrate again before exposure processing, the sublimates attached to the substrate can be reliably removed by the second processing unit. It is therefore possible to reliably prevent the contamination inside the exposure device. As a result of the foregoing, processing defects of the substrate can be reliably reduced.

In addition, adjusting the flow rate of the gas allows adjustments to be easily made to the detergency in washing the substrate. Thus, when the film on the substrate is prone to damage, damage to the film on the substrate can be prevented by weakening the detergency. Tough contaminants on the substrate surface can also be removed reliably by strengthening the detergency. By adjusting the detergency in this way according to the properties of the film on the substrate and the degree of contamination, it is possible to prevent damage to the film on the substrate while washing the substrate reliably.

(13) The gas may be an inert gas. In this case, it is possible to prevent a chemical influence upon the film on the substrate and the washing liquid while removing the contaminants on the substrate surface more reliably, even if a chemical solution is used as washing liquid.

(14) The second processing unit may further dry the substrate after washing the substrate.

This prevents the attachment of particles and the like in the atmosphere to the washed substrate. Also, if the washing liquid remains on the washed substrate, the component of the processing liquid may be eluted in the residual washing liquid. Thus, by drying the washed substrate, it is possible to prevent the component of the processing liquid on the substrate from being eluted in the washing liquid remaining on the substrate. It is therefore possible to reliably prevent a defective shape of the film of the processing liquid that is applied on the substrate and the contamination inside the exposure device. As a result of the foregoing, processing defects of the substrate can be reliably prevented.

(15) The second processing unit may include an inert gas supplier that dries the substrate by supplying an inert gas onto the substrate. The use of the inert gas prevents a chemical influence upon the film on the substrate while reliably drying the substrate.

(16) The fluid nozzle may functions as inert gas supplier. In this case, the inert gas is supplied onto the substrate from the fluid nozzle to apply drying processing to the substrate. This obviates the need to provide the inert gas supplier separately from the fluid nozzle. As a result, the washing and drying processings can be reliably applied to the substrate with a simple structure.

(17) The second processing unit may further include a substrate holding device that holds the substrate substantially horizontally, and a rotation-driving device that rotates the substrate held on the substrate holding device about an axis vertical to the substrate.

In the second processing unit, the substrate is held on the substrate holding device substantially horizontally, and the substrate is rotated about the axis vertical to the substrate by the rotation-driving device. Further, the fluid mixture is supplied onto the substrate from the fluid nozzle, followed by the supply of the inert gas from the inert gas supplier.

In this case, since the substrate is rotated as the fluid mixture is supplied onto the substrate, the fluid mixture on the substrate moves toward the peripheral portion of the substrate by the centrifugal force and splashed away. This reliably prevents the deposits of particles and the like removed by the fluid mixture from remaining on the substrate. In addition, since the substrate is rotated as the inert gas is supplied onto the substrate, the fluid mixture remaining on the substrate after the washing of the substrate is efficiently removed. This reliably prevents the deposits of particles and the like from remaining on the substrate while drying the substrate reliably. As a result, the substrate can be prevented from operational troubles reliably.

(18) The second processing unit may supply the inert gas so that the fluid mixture supplied onto the substrate from the fluid nozzle is removed from the substrate as the fluid mixture moves outwardly from the center of the substrate.

This prevents the fluid mixture from remaining on the center of the substrate, thus reliably preventing the generation of dry marks on a surface of the substrate. Accordingly, the substrate can be prevented from processing defects reliably.

(19) The second processing unit may further include a rinse liquid supplier that supplies a rinse liquid onto the substrate, after the supply of the fluid mixture from the fluid nozzle and before the supply of the inert gas from said inert gas supplier.

This allows the fluid mixture to be reliably cleaned away by the rinse liquid, thus reliably preventing the deposits of particles and the like from remaining on the substrate.

(20) The fluid nozzle may function as the rinse liquid supplier. In this case, the rinse liquid is supplied from the fluid nozzle. This obviates the need to provide the rinse liquid supplier separately from the fluid nozzle. As a result, the washing and drying processings can be reliably applied to the substrate with a simple structure.

(21) The second processing unit may supply the inert gas so that the rinse liquid supplied onto the substrate from the rinse liquid supplier is removed from the substrate as the rinse liquid moves outwardly from the center of the substrate.

This prevents the rinse liquid from remaining on the center of the substrate, thus reliably preventing the generation of dry marks on the surface of the substrate. Accordingly, the substrate can be reliably prevented from processing defects.

(22) The fluid nozzle may have a liquid flow passage through which a liquid flows, a gas flow passage through which a gas flows, a liquid discharge port having an opening that communicates with the liquid flow passage, and a gas discharge port that is provided near the liquid discharge port and having an opening that communicates with the gas flow passage.

In this case, the washing liquid flows through the liquid flow passage, and discharged from the liquid discharge port, while the gas flows through the gas flow passage, and discharged from the gas discharge port. The washing liquid and gas are mixed outside the fluid nozzle. A mist-like fluid mixture is thus generated.

In this way, the fluid mixture is generated by mixing the washing liquid and the gas outside the fluid nozzle. This obviates the need to provide space for mixing the washing liquid and the gas inside the fluid nozzle. As a result, the size of the fluid nozzle can be reduced.

(23) A substrate processing method according to still another aspect of the invention for processing a substrate in a substrate processing apparatus that is arranged adjacent to an exposure device and comprises a first processing unit, a transport device, and a second processing unit comprises the steps of applying a processing liquid to the substrate by the first processing unit, transporting the substrate to the second processing unit by the transport device before exposure processing by the exposure device, washing the substrate by the second processing unit, and transporting the substrate washed by the second processing unit to the exposure device by the transport device.

In the substrate processing apparatus, the processing liquid is applied to the substrate by the first processing unit, and then the substrate is transported to the second processing unit by the transport device. The substrate is washed by the second processing unit, and then transported to the exposure device by the transport device.

In this way, the substrate is washed by the second processing unit before the exposure processing by the exposure device. Part of a component of the processing liquid that is applied on the substrate by the first processing unit is thus eluted, and washed away. In this case, even if the substrate in contact with a liquid is subjected to the exposure processing by the exposure device, the component of the processing liquid on the substrate is hardly eluted. This reduces contamination of the lens and the like of the exposure device while preventing the component of the processing liquid from remaining on a surface of the substrate. As a result, processing defects in the substrate that may be generated in the exposure device can be reduced.

(24) The method may further comprise the step of drying the substrate by the second processing unit after the step of washing the substrate by the second processing unit and before the step of transporting the substrate to the exposure device by the transport device.

In this case, the washed substrate is dried by the second processing unit, which prevents the attachment of particles and the like in the atmosphere on the washed substrate. Also, if the washing liquid remains on the washed substrate, a component of the processing liquid may be eluted in the residual washing liquid. Thus, by drying the washed substrate, it is possible to prevent the component of the processing liquid from being eluted in the washing liquid remaining on the substrate. It is therefore possible to reliably prevent a defective shape of the film of the processing liquid that is applied on the substrate and the contamination inside the exposure device. As a result of the foregoing, processing defects of the substrate can be reliably prevented.

According to the invention, the substrate is washed by the second processing unit before the exposure processing by the exposure device. Part of a component of the processing liquid applied on the substrate by the first processing unit is thus eluted, and washed away. In this case, even if the substrate in contact with a liquid is subjected to the exposure processing by the exposure device, the component of the processing liquid on the substrate is hardly eluted. This reduces contamination of the lens and the like of the exposure device while preventing the component of the processing liquid from remaining on a surface of the substrate. As a result, processing defects in the substrate that may be generated in the exposure device can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a schematic diagram of a nozzle in which a nozzle for washing processing and a nozzle for drying processing are formed integrally;

FIG. 7 is a schematic diagram showing another example of the nozzle for drying processing;

FIG. 9 is a schematic diagram showing another example of the nozzle for drying processing;

DETAILED DESCRIPTION OF THE INVENTION

A substrate processing apparatus according to an embodiment of the invention will be described with reference to the drawings. A substrate as used in the specification includes a semiconductor substrate, a substrate for a liquid crystal display, a substrate for a plasma display, a glass substrate for a photomask, a substrate for an optical disk, a substrate for a magnetic disk, a substrate for a magneto-optical disk, and a substrate for a photomask.

Figure 1:
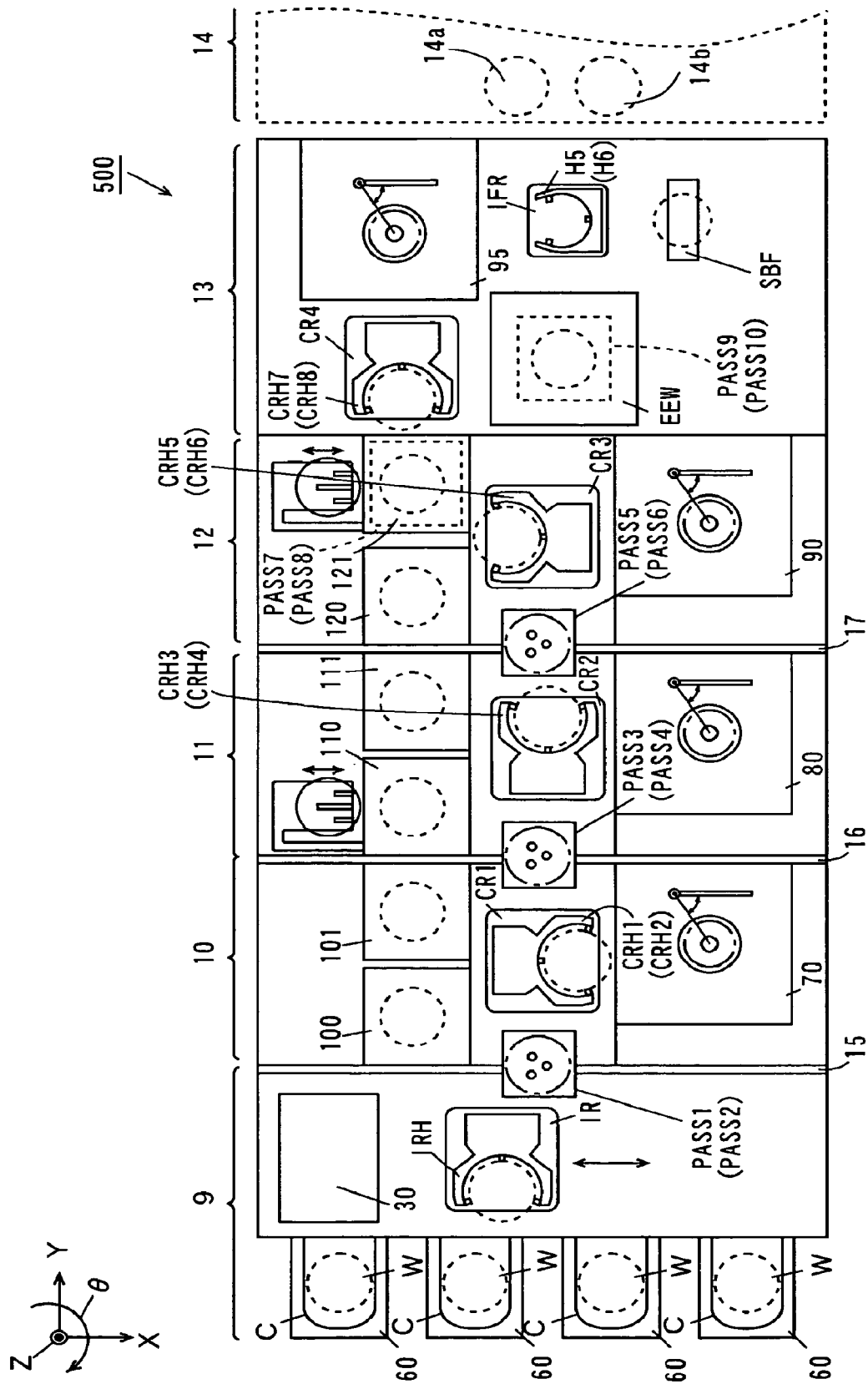
FIG. 1 is a schematic plan view of a substrate processing apparatus according to an embodiment of the invention.

FIG. 1 is a plan view of the semiconductor laser apparatus 10 according to the embodiment of the invention.

Each of FIG. 1 and the subsequent drawings is accompanied by the arrows that indicate X, Y, and Z directions perpendicular to one another for clarification of positions. The X and Y directions are perpendicular to each other in a horizontal plane, and the Z direction corresponds to the vertical direction. In each of the directions, the direction toward an arrow is defined as + direction, and the opposite direction is defined as − direction. The rotation direction about the Z direction is defined as θ direction.

As shown in FIG. 1, the substrate processing apparatus 500 includes an indexer block 9, an anti-reflection film processing block 10, a resist film processing block 11, a development processing block 12, and an interface block 13. An exposure device 14 is arranged adjacent to the interface block 13. The exposure device 14 applies exposure processing to substrates W by a liquid immersion method.

Each of the indexer block 9, the anti-reflection film processing block 10, the resist film processing block 11, the development processing block 12, and the interface block 13 will hereinafter be referred to as a processing block.

The indexer block 9 includes a main controller (controller) 30 for controlling the operation of each processing block, a plurality of carrier platforms 60, and an indexer robot IR. The indexer robot IR has a hand IRH for receiving and transferring the substrates W.

The anti-reflection film processing block 10 includes thermal processing groups 100, 101 for anti-reflection film, a coating processing group 70 for anti-reflection film, and a first central robot CR1. The coating processing group 70 is arranged opposite to the thermal processing groups 100, 101 with the first central robot CR1 therebetween. The first central robot CR1 has hands CRH1, CRH2 provided one above the other for receiving and transferring the substrates W.

A partition wall 15 is arranged between the indexer block 9 and the anti-reflection film processing block 10 for shielding an atmosphere. The partition wall 15 has substrate platforms PASS1, PASS2 provided closely one above the other for receiving and transferring the substrates W between the indexer block 9 and the anti-reflection film processing block 10. The upper substrate platform PASS1 is used in transferring the substrates W from the indexer block 9 to the anti-reflection film processing block 10, and the lower substrate platform PASS2 is used in transferring the substrates W from the anti-reflection film processing block 10 to the indexer block 9.

Each of the substrate platforms PASS?, PASS2 has an optical sensor (not shown) for detecting the presence or absence of a substrate W. This enables a determination to be made whether or not a substrate W is on the substrate platform PASS1, PASS2. In addition, each of the substrate platforms PASS1, PASS2 has a plurality of support pins secured thereto. Note that each of substrate platforms PASS3 to PASS10 mentioned below similarly has such an optical sensor and support pins.

The resist film processing block 11 includes thermal processing groups 110, 111 for resist film, a coating processing group 80 for resist film, and a second central robot CR2. The coating processing group 80 is arranged opposite to the thermal processing groups 110, 111 with the second central robot CR2 therebetween. The second central robot CR2 has hands CRH3, CRH4 provided one above the other for receiving and transferring the substrates W.

A partition wall 16 is arranged between the anti-reflection film processing block 10 and the resist film processing block 11 for shielding an atmosphere. The partition wall 16 has substrate platforms PASS3, PASS4 provided closely 25 one above the other for receiving and transferring the substrates W between the anti-reflection film processing block 10 and the resist film processing block 11. The upper substrate platform PASS3 is used in transferring the substrates W from the anti-reflection film processing block 10 to the resist film processing block 11. The lower substrate platform PASS4 is used in transferring the substrates W from the resist film processing block 11 to the anti-reflection film processing block 10.

The development processing block 12 includes thermal processing groups 120, 121 for development, a development processing group 90, and a third central robot CR3. The thermal processing group 121, adjacent to the interface block 13, comprises the substrate platforms PASS7, PASS8 as described below. The development processing group 90 is arranged opposite to the thermal processing groups 120, 121 with the third central robot therebetween. The third central robot CR3 has hands CRH5, CRH6 provided one above the other for receiving and transferring the substrates W.

A partition wall 17 is arranged between the resist film processing block 11 and the development processing block 12 for shielding an atmosphere. The partition wall 17 has substrate platforms PASS5, PASS6 provided closely one above the other for receiving and transferring the substrates W between the resist film processing block 11 and the development processing block 12. The upper substrate platform PASS5 is used in transferring the substrates W from the resist film processing block 11 to the development processing block 12, and the lower substrate platform PASS6 is used in transferring the substrates W from the development processing block 12 to the resist film processing block 11.

The interface block 13 includes a fourth central robot CR4, a buffer unit SBF, an interface transport mechanism IFR, edge exposure units EEW, and a washing processing group 95. Return buffer units RBF1, RBF2 and substrate platforms PASS9, PASS10 mentioned below are provided under the edge exposure units EEW. The fourth central robot CR4 has hands CRH7, CRH8 provided one above the other for receiving and transferring the substrates W.

The interface transport mechanism IFR has hands H5, H6 for receiving and transferring the substrates W. The interface transport mechanism IFR exchanges a substrate W between the substrate platform PASS9 and the washing processing group 95, between the washing processing group 95 and the exposure device 14, and between the exposure device 14 and the substrate platform PASS10. The interface transport mechanism IFR will be described in detail below.

In the substrate processing apparatus 500 according to this embodiment, the indexer block 9, the anti-reflection film processing block 10, the resist film processing block 11, the development processing block 12, and the interface block 13 are sequentially arranged in parallel along the Y direction.

Figure 2:
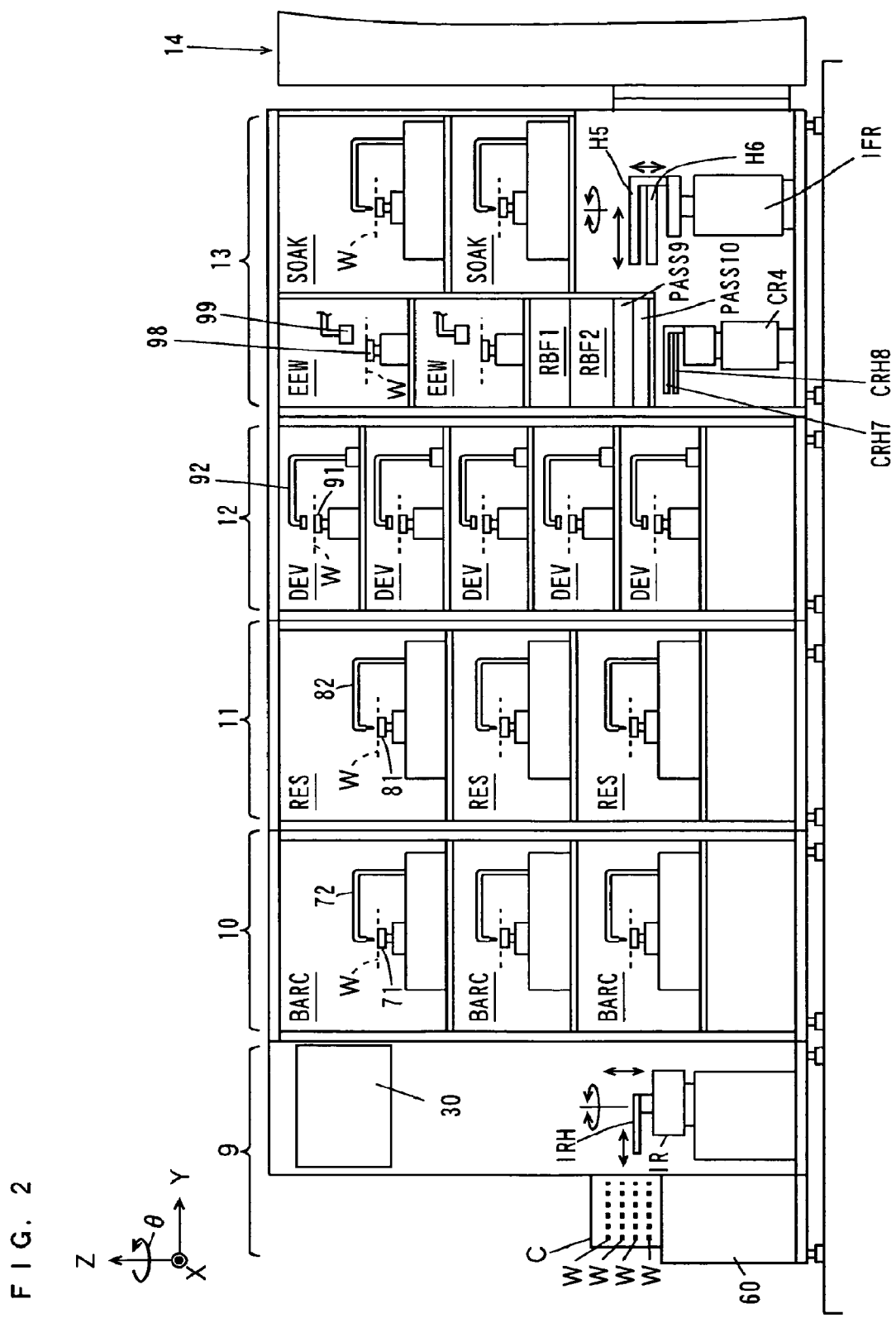
FIG. 2 is a side view of the substrate processing apparatus in FIG. 1 that is seen from the +X direction.

FIG. 2 is a side view of the substrate processing apparatus 500 in FIG. 1 that is seen from the +X direction.

The coating processing group 70 in the anti-reflection film processing block 10 (see FIG. 1) includes a vertical stack of three coating units BARC. Each of the coating units BARC comprises a spin chuck 71 for rotating a substrate W while holding the substrate W in a horizontal attitude by suction, and a supply nozzle 72 for supplying coating liquid for anti-reflection film to the substrate W held on the spin chuck 71.

The coating processing group 80 in the resist film processing block 11 (see FIG. 1) includes a vertical stack of three coating units RES. Each of the coating units RES comprises a spin chuck 81 for rotating a substrate W while holding the substrate W in a horizontal attitude by suction, and a supply nozzle 82 for supplying coating liquid for resist film to the substrate W held on the spin chuck 81.

The development processing group 90 in the development processing block 12 includes a vertical stack of five development processing units DEV. Each of the development processing units DEV comprises a spin chuck 91 for rotating a substrate W while holding the substrate W in a horizontal attitude by suction, and a supply nozzle 92 for supplying development liquid to the substrate W held on the spin chuck 91.

The interface block 13 includes, on the development processing block 12 side thereof, a vertical stack of the two edge exposure units EEW, the return buffers RBF1, RBF2, and the substrate platforms PASS9, PASS10 as well as the fourth central robot CR4. Each of the edge exposure units EEW comprises a spin chuck 98 for rotating a substrate W in a horizontal attitude by suction, and a light irradiator 99 for subjecting a peripheral portion of the substrate W held on the spin chuck 98 to exposure.

The interface block 13 also includes, on the exposure device 14 side thereof, the washing processing group 95 (see FIG. 1) and the interface transport mechanism IFR. The washing processing group 95 includes a vertical stack of two washing processing units SOAK. Each of the washing processing units SOAK applies washing and drying processings to a substrate W. The washing processing units SOAK will be described in detail below.

Figure 3:
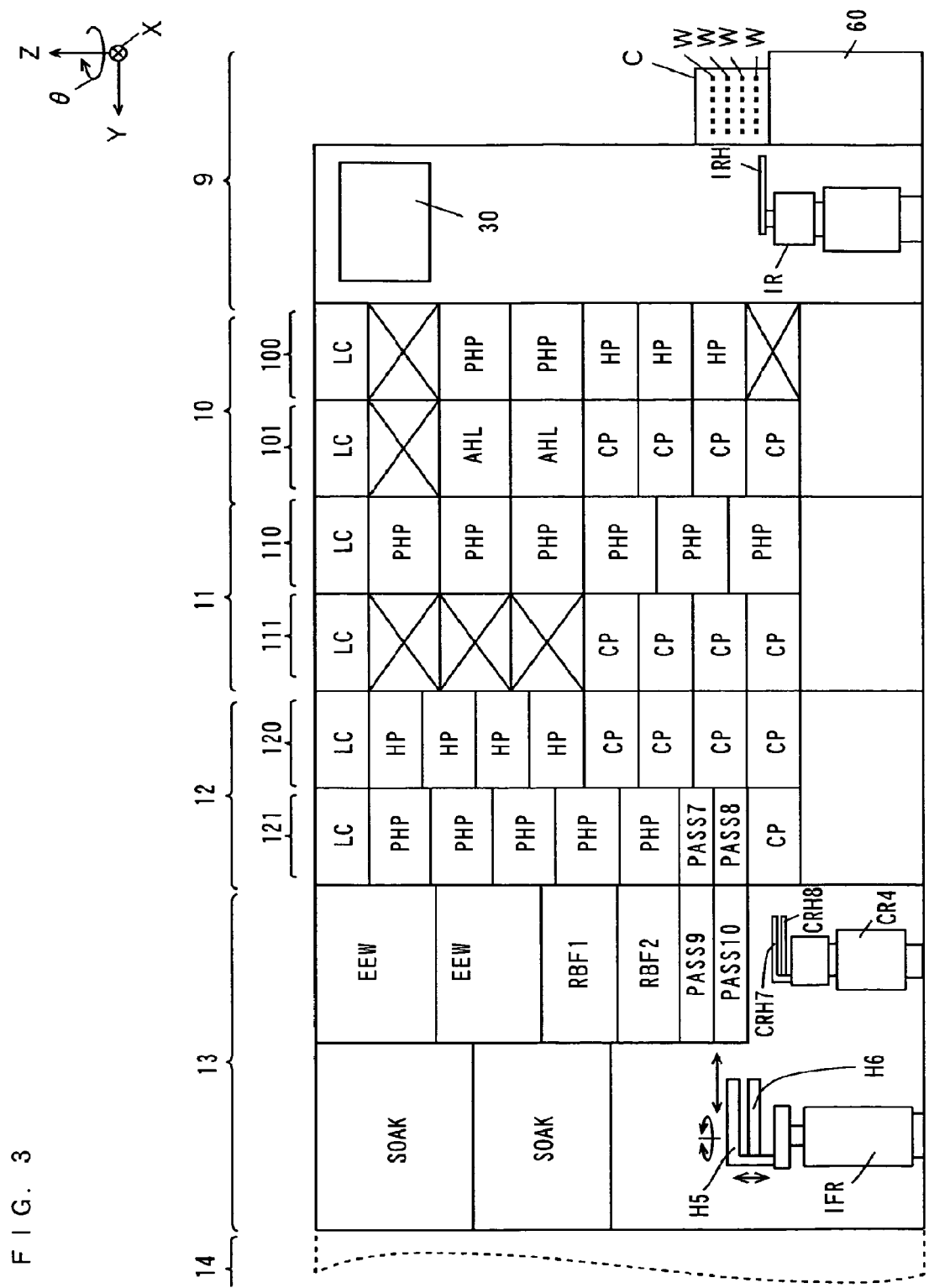
FIG. 3 is a side view of the substrate processing apparatus in FIG. 1 that is seen from the −X direction.

FIG. 3 is a side view of the substrate processing apparatus 500 in FIG. 1 that is seen from the −X direction.

In the anti-reflection film processing block 10, the thermal processing group 100 includes a vertical stack of two thermal processing units PHP each having an interface unit (hereinafter simply referred to as thermal processing units) and three hotplates HP, and the thermal processing group 101 includes a vertical stack of two adhesion agent coating processing units AHL and four cooling plates CP. The thermal processing group 100 also includes a local controller LC on top thereof for controlling the temperatures of the thermal processing units PHP and the hot plates HP, and the thermal processing group 101 also includes a local controller LC on top thereof for controlling the temperatures of the adhesion agent coating processing units AHL and the cooling plates CP.

In the resist film processing block 11, the thermal processing group 110 includes a vertical stack of six thermal processing units PHP, and the thermal processing group 111 includes a vertical stack of four cooling plates CP. The thermal processing group 110 also includes a local controller LC on top thereof for controlling the temperatures of the thermal processing units PHP, and the thermal processing group 111 also includes a local controller LC on top thereof for controlling the temperatures of the cooling plates CP.

In the development processing block 12, the thermal processing group 120 includes a vertical stack of four hot plates CP and four cooling plates CP, and the thermal processing group 121 includes a vertical stack of five thermal processing units PHP, substrate platforms PASS7, PASS8, and a cooling plate CP. The thermal processing group 120 includes a local controller LC on top thereof for controlling the temperatures of the hot plates HP and the cooling plates CP, and the thermal processing group 121 includes a local controller LC on top thereof for controlling the temperatures of the thermal processing units PHP and the cooling plate CP.

Next, the operation of the substrate processing apparatus 500 in this embodiment will be described.

Carriers C for storing the substrates W in multiple stages are mounted on the carrier platforms 60, respectively, in the indexer block 9. The indexer robot IR takes out a substrate W yet to be processed which is stored in a carrier C using the hand IRH for receiving and transferring the substrates W. Then, the indexer robot IR moves in the ±X direction while rotating in the ±θ direction to transfer the unprocessed substrate W onto the substrate platform PASS1.

Although FOUPs (Front Opening Unified Pods) are adopted as the carriers C in this embodiment, SMIF (Standard Mechanical Inter Face) pods or OCs (Open Cassettes) that expose stored substrates W to outside air may also be used, for example. In addition, although linear-type transport robots that move their hands forward or backward by sliding them linearly to a substrate W are used as the indexer robot IR, the first central robot CR1 to the fourth central robot CR4, and the interface transport mechanism IFR, multi joint type transport robots that linearly move their hands forward and backward by moving their joints may also be used.

The unprocessed substrate W that has been transferred onto the substrate platform PASS1 is received by the hand CRH1 of the first central robot CR1 in the anti-reflection film processing block 10. The first central robot CR1 carries the substrate W into the thermal processing group 100 or 101 with the hand CRH1. After this, the first central robot CR1 takes out the thermally treated substrate W from the thermal processing group 100 or 101 with the hand CRH2, and then carries the substrate W into the coating processing group 70. The coating processing group 70 forms a coating of an anti-reflection film over a lower portion of a photoresist film using a coating unit BARC, in order to reduce a standing wave and halation that may be generated during exposure.

The first central robot CR1 subsequently takes out the substrate W after the coating processing from the coating processing group 70 with the hand CRH1, and carries the substrate W into the thermal processing group 100 or 101. Then, the first central robot CR1 takes out the thermally treated substrate W from the thermal processing group 100 or 101 with the hand CRH2, and transfers the substrate W onto the substrate platform PASS3.

The substrate W on the substrate platform PASS3 is received by the hand CRH3 of the second central robot CR2 in the resist film processing block 11. The second central robot CR2 carries the substrate W into the thermal processing group 110 or 111 with the hand CRH3. The second central robot CR2 then takes out the thermally treated substrate W from the thermal processing group 110 or 111 with the hand CRH4, and carries the substrate W into the coating processing group 80. In the coating processing group 80, a coating unit RES forms a coating of a resist film over the substrate W that is coated with the anti-reflection film.

After this, the second central robot CR2 takes out the substrate W after the coating processing from the coating processing group 80 with the hand CRH3, and carries the substrate W into the thermal processing group 110 or 111. Then, the second central robot CR2 takes out the thermally treated substrate W from the thermal processing group 110 or 111 with the hand 10 CRH4, and transfers the substrate W onto the substrate platform PASS5.

The substrate W on the substrate platform PASS5 is received by the hand CRH5 of the third central robot CR3 in the development processing block 12. The third central robot CR3 transfers the substrate W onto the substrate platform PASS7 with the hand CRH5. The substrate W on the substrate platform PASS7 is received by the upper hand CRH7 of the fourth central robot CR4 in the interface block 13. The fourth central robot CR4 carries the substrate W into an edge exposure unit EEW with the hand CRH7. The edge exposure unit EEW subjects the peripheral portion of the substrate W to exposure processing.

The fourth central robot CR4 then takes out the substrate W after the edge exposure processing from the edge exposure unit EEW with the hand CRH7, and transfers the substrate W to 25 the substrate platform PASS9.

The substrate W transferred onto the substrate platform PASS9 is carried into a washing processing unit SOAK by the interface transport mechanism IFR. The substrate W is subjected to washing and drying processings by the washing processing unit SOAK, and then carried into the exposure device 14 by the interface transport mechanism IFR. The substrate W is subjected to exposure processing by the exposure device 14, and then transferred onto the substrate platform PASS10 by the interface transport mechanism IFR. The interface transport mechanism IFR will be described in detail below.

The substrate W on the substrate platform PASS10 is received by the lower hand CRH8 of the fourth central robot CR4 in the interface block 13. The fourth central robot CR4 carries the substrate W into the thermal processing group 121 in the development processing block 12 with the hand CRH8. The substrate W is subjected to thermal treatment by the thermal processing group 121. Then, the fourth central robot CR4 takes out the substrate W from the thermal processing group 121, and transfers the substrate W onto the substrate platform PASS8.

The substrate W on the substrate platform PASS8 is received by the hand CRH6 of the third central robot CR3 in the development processing block 12. The third central robot CR3 carries the substrate W into the development processing group 90 with the hand CRH6. The exposed substrate W is subjected to development processing by the development processing group 90.

After this, the third central robot CR3 takes out the substrate W after the development processing from the development processing group 90 with the hand CRH5, and carries the substrate W into the thermal processing group 120.

Then, the third central robot CR3 takes out the thermally treated substrate W from the thermal processing group 120 with the hand CRH6, and transfers the substrate W onto the substrate platform PASS6 provided in the resist film processing block 11.

If the development processing group 90 is temporarily not capable of applying development processing to the substrate W by, e.g., a failure, the substrate W may temporarily be stored in the return buffer RBF1 in the interface block 13 after the thermal treatment in the thermal processing group 121.

The substrate W on the substrate platform PASS6 is transferred onto the substrate platform PASS4 by the hand CRH4 of the second central robot CR2 in the resist film processing block 11. The substrate W on the substrate platform PASS4 is transferred onto the substrate platform PASS2 by the hand CRH2 of the first central robot CR1 in the anti-reflection film processing block 10.

The substrate W on the substrate platform PASS2 is stored in a carrier C by the indexer robot IR in the indexer block 9. Each of the processings to the substrate W in the substrate processing apparatus is thus completed.

Now, the aforementioned washing processing units SOAK will be described in detail with reference to drawings.

Figure 4:
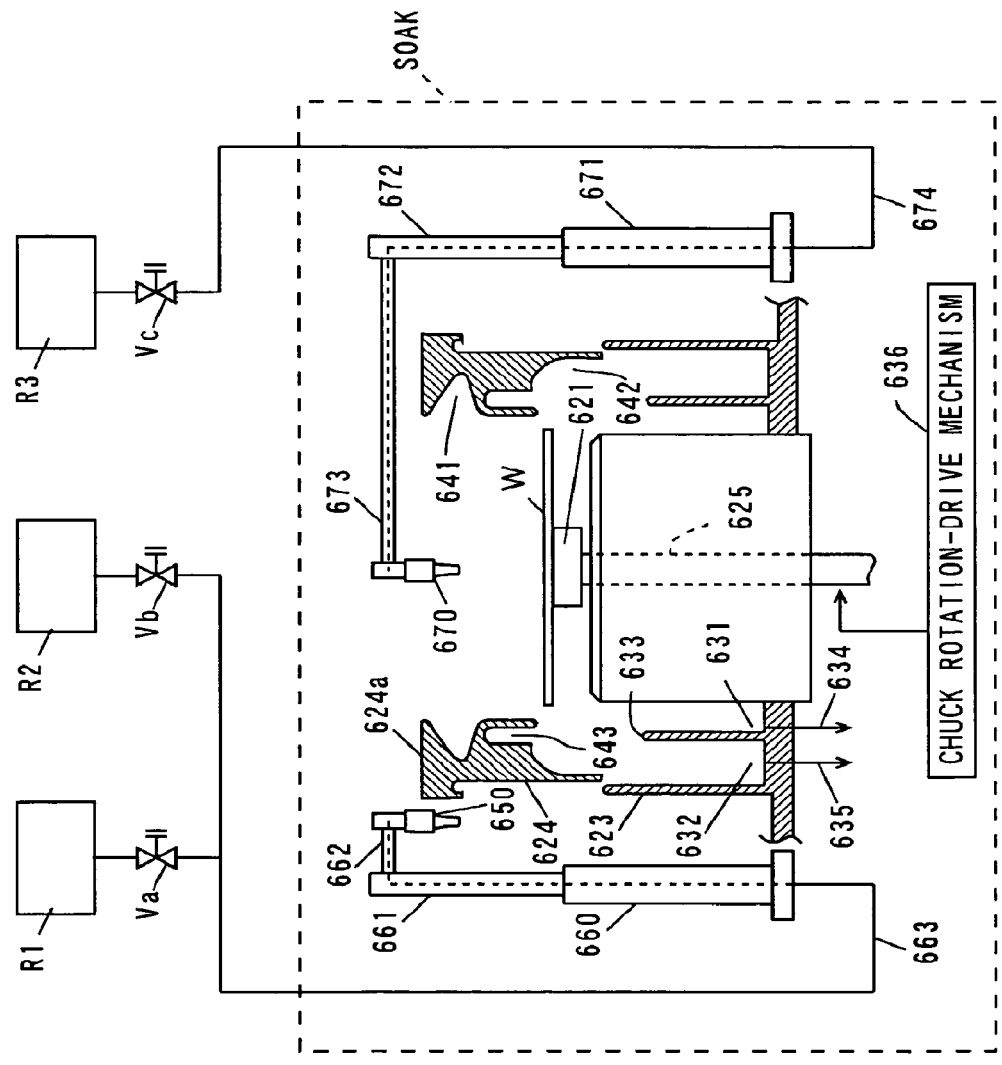
FIG. 4 is a diagram for use in illustrating the configuration of a washing processing unit.

The configuration of a washing processing unit SOAK is first described. FIG. 4 is a diagram for use in illustrating the configuration of the washing processing unit SOAK.

As shown in FIG. 4, the washing processing unit SOAK comprises a spin chuck 621 for rotating a substrate W about the vertical rotation axis passing through the center of the substrate W while horizontally holding the substrate W.

The spin chuck 621 is secured to an upper end of a rotation shaft 625, which is rotated via a chuck rotation-drive mechanism 636. An air suction passage (not shown) is formed in the spin chuck 621. With the substrate W being mounted on the spin chuck 621, air inside the air suction passage is discharged, so that a lower surface of the substrate W is sucked onto the spin chuck 621 by vacuum, and the substrate W can be held in a horizontal attitude.

A first rotation motor 660 is arranged outside the spin chuck 621. The first rotation motor 660 is connected to a first rotation shaft 661. The first rotation shaft 661 is coupled to a first arm 662, which extends in the horizontal direction, and whose end is provided with a nozzle 650 for washing processing.

The first rotation shaft 661 is rotated by the first rotation motor 660, so that the first arm 662 swings. This causes the nozzle 650 to move above the substrate W held on the spin chuck 621.

A supply pipe 663 for washing processing is arranged so as to pass through the inside of the first rotation motor 660, the first rotation shaft 661, and the first arm 662. The supply pipe 663 is connected to a washing liquid supply source R1 and a rinse liquid supply source R2 through a valve Va and a valve Vb, respectively. By controlling the opening and closing of the valves Va, Vb, it is possible to select, a processing liquid supplied to the supply pipe 663 and adjust the amount of the processing liquid. In the configuration of FIG. 4, when the valve Va is opened, washing liquid is supplied to the supply pipe 663, and when the valve Vb is opened, rinse liquid is supplied to the supply pipe 663.

The washing liquid or the rinse liquid is supplied to the nozzle 650 through the supply pipe 663 from the washing liquid supply source R1 or the rinse liquid supply source R2. The washing liquid or the rinse liquid is thus supplied to a surface of the substrate W. Examples of the washing liquid may include pure water, a pure water solution containing a complex (ionized), or a fluorine-based chemical solution. Examples of the rinse liquid may include pure water, carbonated water, hydrogen water, electrolytic ionic water, and HFE (hydrofluoroether).

A second rotation motor 671 is arranged outside the spin chuck 621. The second rotation motor 671 is connected to a second rotation shaft 672. The second rotation shaft 672 is coupled to a second arm 673, which extends in the horizontal direction, and whose end is provided with a nozzle 670 for drying processing.

The second rotation shaft 672 is rotated by the second rotation motor 671, so that the second arm 673 swings. This causes the nozzle 670 to move above the substrate W held on the spin chuck 621.

A supply pipe 674 for drying processing is arranged so as to pass through the inside of the second rotation motor 671, the second rotation shaft 672, and the second arm 673. The supply pipe 674 is connected to an inert gas supply source R3 through a valve Vc. By controlling the opening and closing of the valve Vc, it is possible to adjust the amount of the inert gas supplied to the supply pipe 674.

The inert gas is supplied to the nozzle 670 through the supply pipe 674 from the inert gas supply source R3. The inert gas is thus supplied to the surface of the substrate W. Nitrogen gas (N2), for example, may be used as the inert gas.

When supplying the washing liquid or the rinse liquid onto the surface of the substrate W, the nozzle 650 is positioned above the substrate. When supplying the inert gas onto the surface of the substrate W, the nozzle 650 is retracted to a predetermined position.

When supplying the washing liquid or the rinse liquid onto the surface of the substrate W, the nozzle 670 is retracted to a predetermined position. When supplying the inert gas onto the surface of the substrate W, the nozzle 670 is positioned above the substrate W.

The substrate W held on the spin chuck 621 is housed in a processing cup 623. A cylindrical partition wall 633 is provided inside the processing cup 623. A discharge space 631 is formed so as to surround the spin chuck 621 for discharging the processing liquid (i.e., washing liquid or rinse liquid) used in processing the substrate W. Also, a liquid recovery space 632 is formed between the processing cup 623 and the partition wall 633, so as to surround the discharge space 631, for recovering the processing liquid used in processing the substrate W.

The discharge space 631 is connected with a discharge pipe 634 for directing the processing liquid to a liquid discharge processing device (not shown), while the liquid recovery space 632 is connected with a recovery pipe 635 for directing the processing liquid to a recovery processing device (not shown).

A guard 624 is provided above the processing cup 623 for preventing the processing liquid on the substrate W from splashing outward. The guard 624 is configured to be rotation-symmetric with respect to the rotation shaft 625. An annular-shaped liquid discharge guide groove 641 with a V-shaped cross section is formed inwardly of an upper end portion of the guard 624.

Also, a liquid recovery guide 642 having an inclined surface that inclines down outwardly is formed inwardly of a lower portion of the guard 624. A partition wall housing groove 643 for receiving the partition wall 633 in the processing cup 623 is formed in the vicinity of the upper end of the liquid recovery guide 642.

This guard 624 is provided with a guard lifting mechanism (not shown) composed of a ball-screw mechanism or the like. The guard lifting mechanism lifts and lowers the guard 624 between a recovery position in which the liquid recovery guide 642 is positioned opposite to outer edges of the substrate W held on the spin chuck 621 and a discharge position in which the liquid discharge guide groove 641 is positioned opposite to the outer edges of the substrate W held on the spin chuck 621. When the guard 624 is in the recovery position (i.e., the position of the guard shown in FIG. 4), the processing liquid splashed out from the substrate W is directed by the liquid recovery guide 642 to the liquid recovery space 632, and then recovered through the recovery pipe 635. On the other hand, when the guard 624 is in the discharge position, the processing liquid splashed out from the substrate W is directed by the liquid discharge guide groove 641 to the discharge space 631, and then discharged 25 through the discharge pipe 634. With such a configuration, discharge and recovery of the processing liquid is performed.

The processing operation of the washing processing unit SOAK having the aforementioned configuration is next described. Note that the operation of each component in the washing processing unit SOAK described below is controlled by the main controller 30 in FIG. 1.

When the substrate W is initially carried into the washing processing unit SOAK, the guard 624 is lowered, and the interface transport mechanism IFR in FIG. 1 places the substrate W onto the spin chuck 621. The substrate W on the spin chuck 621 is held by suction.

Next, the guard 624 moves to the aforementioned discharge position, and the nozzle 650 moves above the center of the substrate W. Then, the rotation shaft 625 rotates, causing the substrate W held on the spin chuck 621 to rotate. After this, the washing liquid is discharged onto the top surface of the substrate W from the nozzle 650. The substrate W is thus washed, and part of the component of the resist on the substrate W is eluted in the washing liquid. During the washing, the substrate W is rotated as the washing liquid is supplied onto the substrate W. This causes the washing liquid on the substrate W to constantly move toward a peripheral portion of the substrate W by the centrifugal force, and splashed away. It is therefore possible to prevent the component of the resist eluted in the washing liquid from remaining on the substrate W. Note that the aforementioned resist component may be eluted with pure water being poured onto the substrate W and kept thereon for a certain period. The supply of the washing liquid onto the substrate W may also be executed by a soft spray method using a two-fluid nozzle.

After the elapse of a predetermined time, the supply of the washing liquid is stopped, and the rinse liquid is discharged from the nozzle 650. The washing liquid on the substrate W is thus washed away. As a result, it is possible to reliably prevent the resist components eluted in the washing liquid from remaining on the substrate W.

Figure 5:
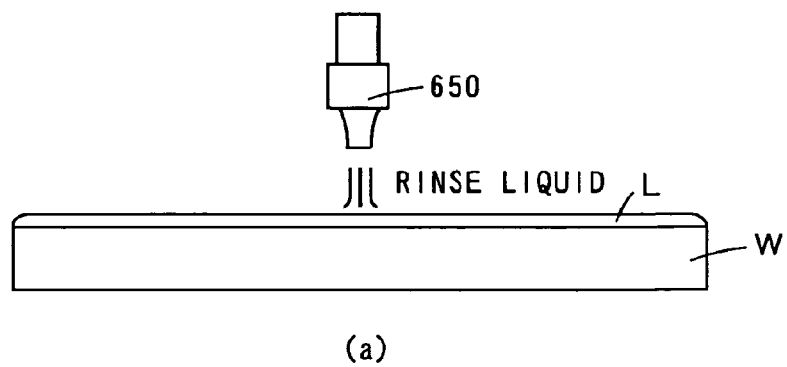
FIGS. 5 (a), 5 (b), and 5 (c) are diagrams for use in illustrating the operation of the washing processing unit.
Figure 5:
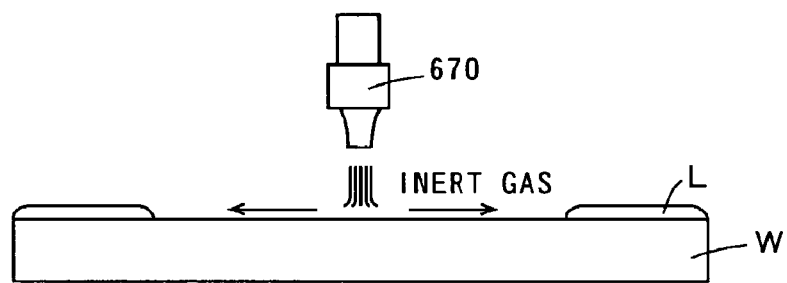
Figure 5:
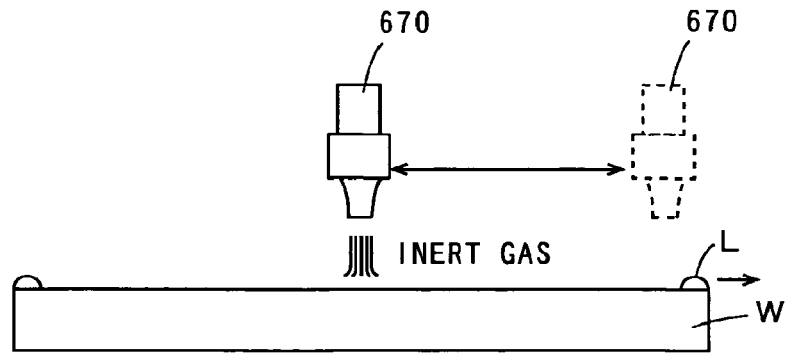

After the elapse of another predetermined time, the rotation speed of the rotation shaft 625 decreases. This reduces the amount of the rinse liquid that is shaken off by the rotation of the substrate W, resulting in the formation of a liquid layer L of the rinse liquid over the entire surface of the substrate W, as shown in FIG. 5 (a). Alternatively, the rotation of the rotation shaft 625 may be stopped to form the liquid layer L over the entire surface of the substrate W.

The embodiment employs the configuration in which the nozzle 650 is used for supplying both the washing liquid and the rinse liquid, so as to supply both the washing liquid and the rinse liquid from the nozzle 650. However, a configuration may also be employed in which nozzles are separately provided for supplying the washing liquid and the rinse liquid.

In order to prevent the rinse liquid from flowing to the back surface of the substrate W during the supply of the rinse liquid, pure water may be supplied to the back surface of the substrate W using a back rinsing nozzle (not shown).

Note that when using pure water as the washing liquid for washing the substrate W, it is not necessary to supply the rinse liquid.

The supply of the rinse liquid is subsequently stopped, and the nozzle 650 retracts to the predetermined position while the nozzle 670 moves above the center of the substrate W. The inert gas is subsequently discharged from the nozzle 670. This causes the rinse liquid around the center of the substrate W to move toward the peripheral portion of the substrate W, leaving the liquid layer L only on the peripheral portion, as shown in FIG. 5 (b).

Next, as the number of revolutions of the rotation shaft 625 (see FIG. 4) increases, the nozzle 670 gradually moves from above the center of the substrate W to above the peripheral portion thereof, as shown in FIG. 5 (c). This causes a great centrifugal force acting on the liquid layer L on the substrate W while allowing the inert gas to be sprayed toward the entire surface of the substrate W, thereby ensuring the removal of the liquid layer L on the substrate W. As a result, the substrate W can be reliably dried.

Then, the supply of the inert gas is stopped, and the nozzle 670 retracts to the predetermined position while the rotation of the rotation shaft 625 is stopped. After this, the guard 624 is lowered, and the interface transport mechanism IFR in FIG. 1 carries the substrate W out of the washing processing unit SOAK. The processing operation of the washing processing unit SOAK is thus completed.

It is preferred that the position of the guard 624 during washing and drying processings is suitably changed according to the necessity of the recovery or discharge of the processing liquid.

Moreover, although the washing processing unit SOAK shown in FIG. 4 includes the nozzle 650 for washing processing and the nozzle 670 for drying processing separately, the nozzle 650 and the nozzle 670 may also be formed integrally, as shown in FIG. 6. This obviates the need to move each of the nozzle 650 and the nozzle 670 separately during the washing or drying processing to the substrate W, thereby simplifying the driving mechanism.

A nozzle 770 for drying processing as shown in FIG. 7 may also be used instead of the nozzle 670 for drying processing.

The nozzle 770 in FIG. 7 extends vertically downward, and also has branch pipes 771, 772 that extend obliquely downward from sides thereof. A gas discharge port 770a is formed at the lower end of the branch pipe 771, a gas discharge port 770b at the lower end of the nozzle 770, and a gas discharge port 770c at the lower end of the branch pipe 772, each for discharging an inert gas. The discharge port 770b discharges an inert gas vertically downward, and the discharge ports 770a, 770c each discharge an inert gas obliquely downward, as indicated by the arrows in FIG. 7. That is to say, the nozzle 770 discharges the inert gas so as to increase the spraying area downwardly.

Now, a washing processing unit SOAK using the nozzle 770 for drying processing applies drying processing to the substrate W as will be described below.

Figure 8:
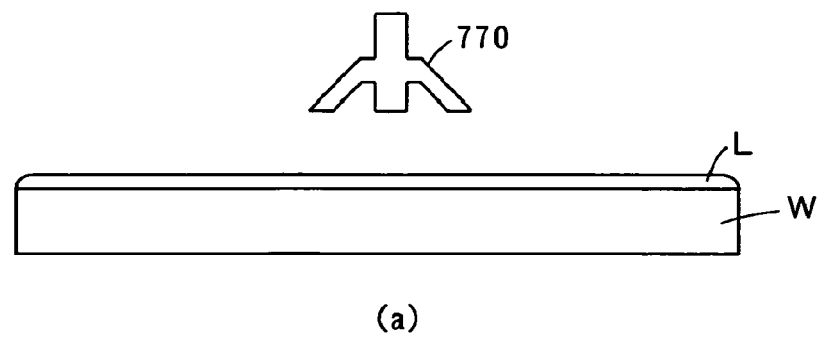
FIGS. 8 (a), 8 (b), and 8 (c) are diagrams for use in illustrating a method of applying drying processing to a substrate using the nozzle in FIG. 7.
Figure 8:
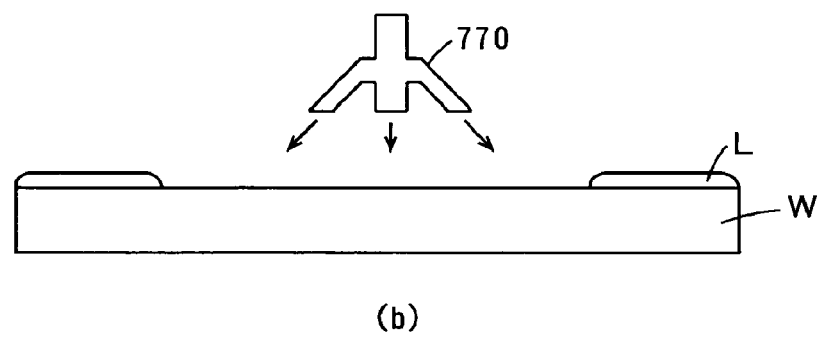
Figure 8:
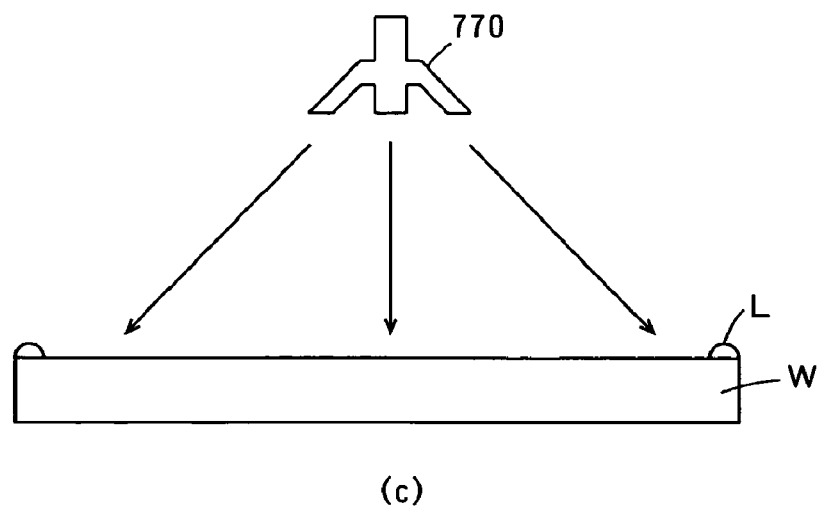

FIGS. 8(a), 8(b), 8(c) are diagrams for use in illustrating a method of applying drying processing to the substrate W using the nozzle 770.

Initially, a liquid layer L is formed on a surface of the substrate W by the method as described in FIG. 6, and then the nozzle 770 moves above the center of the substrate W, as shown in FIG. 8(a). After this, an inert gas is discharged from the nozzle 770. This causes the rinse liquid on the center of the substrate W to move to the peripheral portion of the substrate W, leaving the liquid layer L only on the peripheral portion of the substrate W, as shown in FIG. 8(b). At the time, the nozzle 770 is brought close to the surface of the substrate W so as to reliably move the rinse liquid present on the center of the substrate W.

Next, as the number of revolutions of the rotation shaft 625 (see FIG. 4) increases, the nozzle 770 moves upward as shown in FIG. 8(c). This causes a great centrifugal force acting on the liquid layer L on the substrate W while increasing the area to which the inert gas is sprayed on the substrate W. As a result, the liquid layer L on the substrate W can be reliably removed. Note that the nozzle 770 can be moved up and down by lifting and lowering the second rotation shaft 672 via a rotation shaft lifting mechanism (not shown) provided to the second rotation shaft 672 in FIG. 4.

Alternatively, a nozzle 870 for drying processing as shown in FIG. 9 may be used instead of the nozzle 770. The nozzle 870 in FIG. 9 has a discharge port 870a whose diameter gradually increases downward. This discharge port 870a discharges an inert gas vertically downward and obliquely downward as indicated by the arrows in FIG. 9. That is, similarly to the nozzle 770 in FIG. 7, the nozzle 870 discharges the inert gas so as to increase the spraying area downwardly. Consequently, drying processing similar to that using the nozzle 770 can be applied to the substrate W using the nozzle 870.

Figure 10:
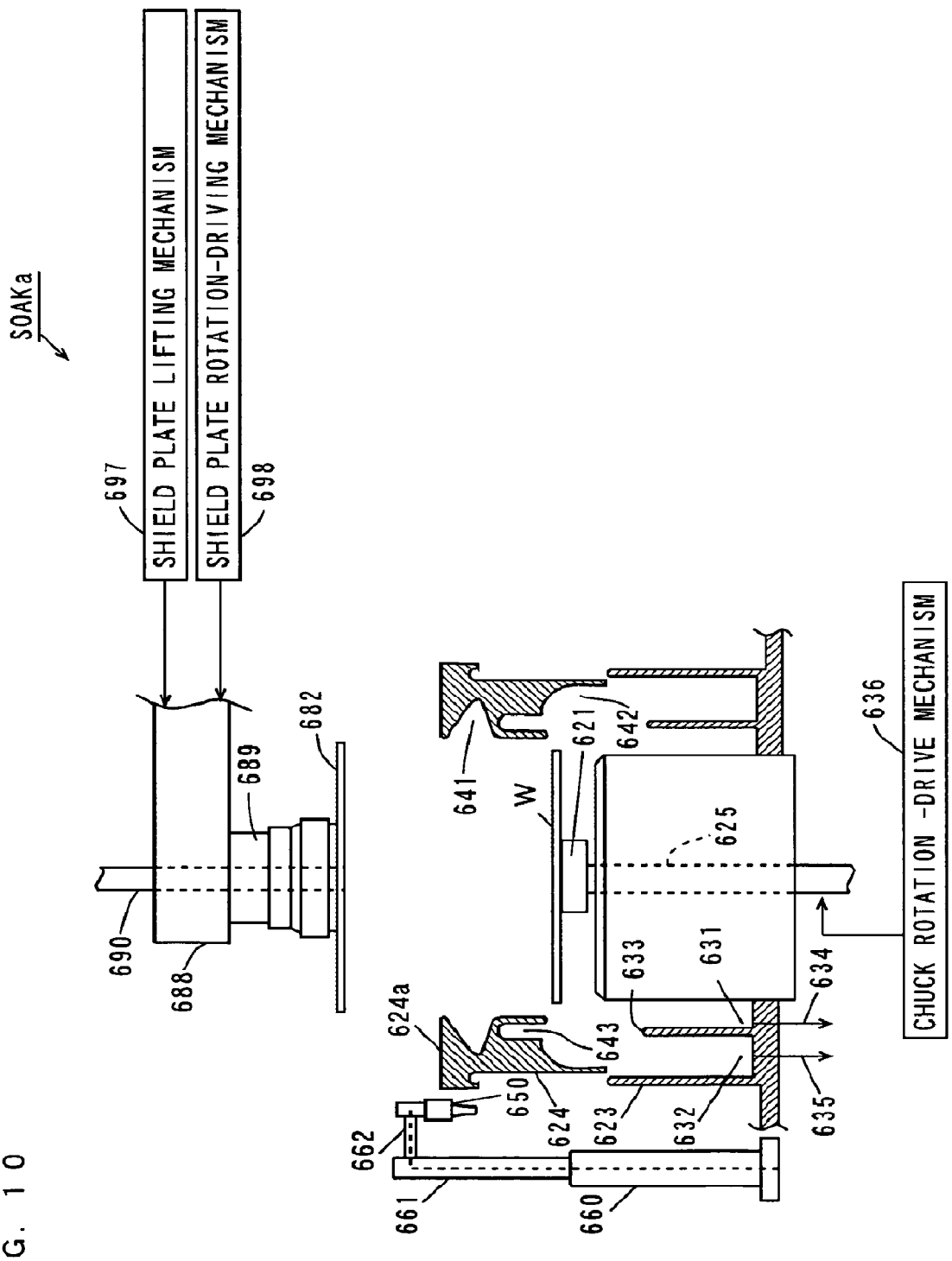
FIG. 10 is a schematic diagram showing another example 10 of the drying processing unit.

A washing processing unit SOAKa as shown in FIG. 10 may also be used instead of the washing processing unit SOAK shown in FIG. 4.

The washing processing unit SOAKa in FIG. 10 is different from the washing processing unit SOAK in FIG. 4 as described below.

The washing processing unit SOAKa in FIG. 10 includes above the spin chuck 621a disk-shaped shield plate 682 having an opening through the center thereof. A support shaft 689 extends vertically downward from around an end of an arm 688, and the shield plate 682 is mounted at a lower end of the support shaft 689 so as to oppose the top surface of the substrate W held on the spin chuck 621.

A gas supply passage 690 that communicates with the opening of the shield plate 682 is inserted into the inside of the support shaft 689. A nitrogen gas (N2), for example, is supplied into the gas supply passage 690.

The arm 688 is connected with a shield plate lifting mechanism 697 and a shield plate rotation-driving mechanism 698. The shield plate lifting mechanism 697 lifts and lowers the shield plate 682 between a position close to the top surface of the substrate W held on the spin chuck 621 and a position upwardly away from the spin chuck 621.

Figure 11:
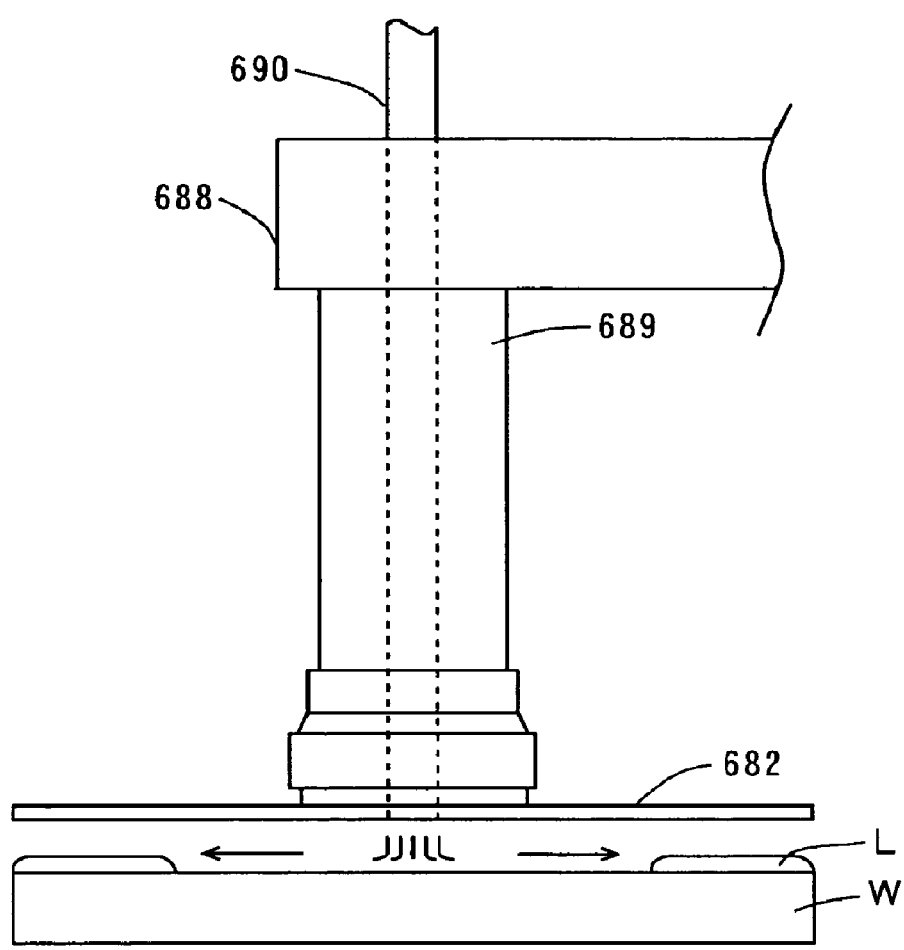
FIG. 11 is a diagram for use in illustrating a method of applying drying processing to the substrate using the drying processing unit in FIG. 10.

During the drying processing to the substrate W in the washing processing unit SOAKa in FIG. 10, with the shield plate 628 brought close to the substrate W as shown in FIG. 11, an inert gas is supplied to clearance between the substrate W and the shield plate 682 from the gas supply passage 690. This allows the inert gas to be efficiently supplied from the center of the substrate W to the peripheral portion thereof, thereby ensuring the removal of the liquid layer L on the substrate W.

Although in the above-described embodiment, the substrate W is subjected to drying processing by spin drying in the washing processing unit SOAK, the substrate W may be subjected to drying processing by other methods such as a reduced pressure drying method or an air knife drying method.

Although in the above-described embodiment, the inert gas is supplied from the nozzle 670 with the liquid layer L of the rinse liquid being formed, the following method may be applied when the liquid layer L of the rinse liquid is not formed or the rinse liquid is not used. That is, the liquid layer of washing liquid is shaken off once by rotating the substrate W, and an inert gas is then immediately supplied from the nozzle 670 to thoroughly dry the substrate W.

As described above, in the substrate processing apparatus 500 according to the embodiment, the substrate W is subjected to the washing processing by the washing processing unit SOAK before the exposure processing by the exposure device 14. During this washing processing, part of the component of the resist on the substrate W is eluted in the washing liquid or the rinse liquid, and washed away. Therefore, even if the substrate W contacts a liquid in the exposure device 14, the component of the resist on the substrate W is hardly eluted in the liquid. This reduces contamination of the lens and the like (not shown) of the exposure device 14 while preventing the resist component from remaining on the surface of the substrate W. As a result, processing defects in the substrate W that may be generated in the exposure device 14 can be reduced.

Moreover, the washing processing unit SOAK applies the drying processing to the substrate W after the washing processing by spraying the inert gas onto the substrate W from the center to the peripheral portion thereof while rotating the substrate W. This ensures that the washing liquid and the rinse liquid are removed from the substrate W, so as to reliably prevent the attachment of particles and the like in the atmosphere on the washed substrate W. It is thus possible to reliably prevent the contamination of the substrate W and the generation of dry marks on the surface of the substrate W.

Also, it is possible to reliably prevent the washing liquid and the rinse liquid from remaining on the washed substrate W, so as to reliably prevent further elution of the resist component in the washing liquid and the rinse liquid during the transport of the substrate W from the washing processing unit SOAK to the exposure device 14. It is thus possible to reliably prevent a defective shape of the resist film and the contamination inside the exposure device 14.

As a result of the foregoing, processing defects in the substrate W can be reliably prevented.

Figure 12:
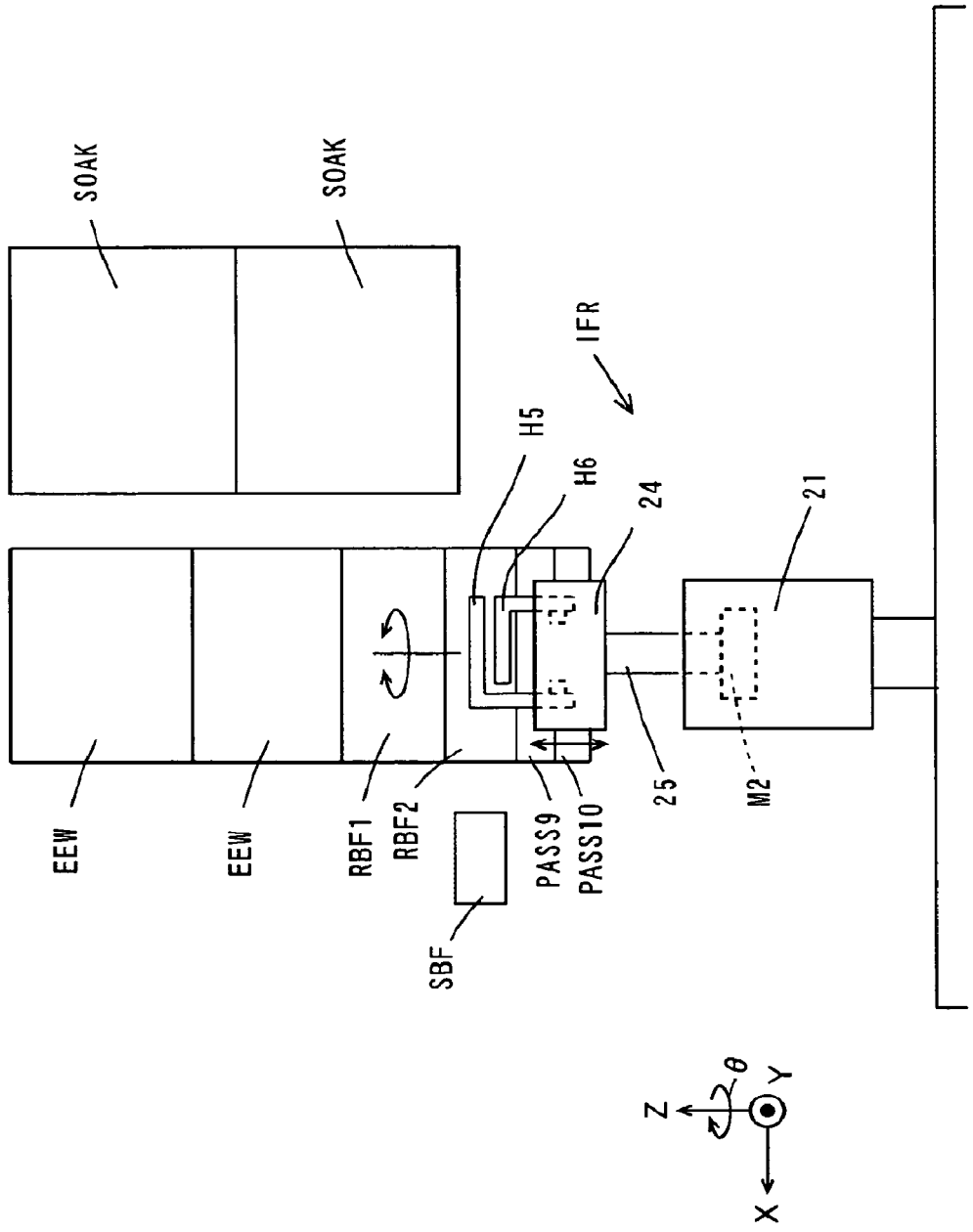
FIG. 12 is a diagram for use in illustrating the 15 configuration and the operation of the interface transport mechanism.

The interface transport mechanism IFR is next described. FIG. 12 is a diagram for illustrating the configuration and the operation of the interface transport mechanism IFR.

The configuration of the interface transport mechanism IFR is first described. As shown in FIG. 12, a hand support base 24 is mounted to a securing base 21 of the interface transport mechanism IFR so as to rotate in the ±θ direction while moving up and down in the ±Z direction. The hand support base 24 is coupled to a motor M2 in the securing base 21 through a rotation shaft 25, and rotated by the motor M2. Two hands H5, H6 for holding the substrate W in a horizontal attitude are mounted to the hand support base 24 one above the other, so as to move forward and backward.

The operation of the interface transport mechanism IFR is next described. The operation of the interface transport mechanism IFR is controlled by the main controller 30 in FIG. 1.

The interface transport mechanism IFR initially rotates the hand support base 24 while lifting the hand support base 24 in the +Z direction, to allow the upper hand H5 to enter the substrate platform PASS9. When the hand H5 has received the substrate W at the substrate platform PASS9, the interface transport mechanism IFR retracts the hand H5 from the substrate platform PASS9.

The interface transport mechanism IFR then rotates the hand support base 24 while lifting the hand support base 24 in the +Z direction, to allow the hand H5 to enter one of the two washing processing units SOAK. After carrying the substrate W into the washing processing unit SOAK, the interface transport mechanism IFR retracts the hand H5 from the washing processing unit SOAK.

Then, the interface transport mechanism IFR lifts or lowers the hand support base 24 in the ±Z direction, to allow the hand H5 to enter the other one of the two washing processing units SOAK. When the hand H5 has received the substrate W after washing processing at the washing processing unit SOAK, the interface transport mechanism IFR retracts the hand H5 from the washing processing unit SOAK.

The interface transport mechanism IFR subsequently rotates the hand support base 24 while lowering the hand support base 24 in the −Z direction, to allow the hand H5 to enter a substrate inlet 14a (see FIG. 1) of the exposure device 14. After carrying the substrate W into the substrate inlet 14a, the interface transport mechanism IFR retracts the hand H5 from the substrate inlet 14a.

Then, the interface transport mechanism IFR allows the lower hand H6 to enter a substrate outlet 14b (see FIG. 1) of the exposure device 14. When the hand H6 has received the substrate W after exposure processing at the substrate outlet 14b, the interface transport mechanism IFR retracts the hand H6 from the substrate outlet 14b.

Then, the interface transport mechanism IFR rotates the hand support base 24 while lifting the hand support base 24 in the +Z direction, to allow the hand H6 to enter the substrate platform PASS10 and transfer the substrate W onto the substrate platform PASS10.

If the washing processing units SOAK are not capable of receiving the substrate W during the transport of the substrate W from the substrate platform PASS9 to the washing processing units SOAK, the substrate W waits at the substrate platform PASS9 until the washing processing units SOAK become capable of receiving the substrate W.

Also, if the exposure device 14 is not capable of receiving the substrate W during the transport of the substrate W from a washing processing unit SOAK to the exposure device 14, the substrate W is transported to the buffer unit SBF once, and waits there until the exposure device 14 becomes capable of receiving the substrate W.

As described above, in this embodiment, the interface transport mechanism IFR employs the hand H5 when transporting the substrate W from the substrate platform PASS9 to a washing processing unit SOAK and from a washing processing unit SOAK to the exposure device 14, and employs the hand H6 when carrying the substrate W from the exposure device 14 to the substrate platform PASS10. That is, the hand H6 is used in transporting the substrate W to which a liquid is attached after the exposure processing, and the hand H5 is used in transporting the substrate W to which no liquid is attached before the exposure processing. This prevents the liquid on the substrate W from attaching to the hand H5.

Moreover, the hand H6 is arranged below the hand H5, so that even if a liquid drops from the hand H6 and the substrate W held thereon, the liquid will not attach to the hand H5 and the substrate W held thereon.

Furthermore, as described above, the fourth central robot CR4 also employs the lower hand CRH8 when transporting the substrate W to which a liquid is attached after the exposure processing (between the substrate platform PASS10 and the thermal processing group 121), and employs the upper hand CRH7 when transporting the substrate W to which no liquid is attached before the exposure processing (between the substrate platform PASS7 and the edge exposure units EEW). This prevents a liquid from attaching to the substrate W before the exposure processing also in the fourth central robot CR4.

As a result of the foregoing, a liquid is prevented from attaching to the substrate W before the exposure processing, so as to prevent the contamination of the substrate W due to the attachment of particles and the like in the atmosphere. This prevents the generation of processing defects in the substrate W due to degradation in the resolution performance and the like of the exposure device 14.

Although in this embodiment, the single interface transport mechanism IFR is used for transporting the substrate W from the substrate platform PASS9 to a washing processing unit SOAK, from a washing processing unit SOAK to the exposure device 14, and from the exposure device 14 to the substrate platform PASS10, a plurality of interface transport mechanisms IFR may also be used for transporting the substrate W.

Furthermore, the numbers of the coating units BARC, RES, the development processing units DEV, the washing processing units SOAK, the thermal processing units PHP, the hotplates HP, the adhesion agent coating processing units AHL, and the cooling plates CP may suitably be changed according to the processing speed of each processing block.

The operation and the configuration of the interface transport mechanism IFR may also be modified according to the positions of the substrate inlet 14a and the substrate outlet 14b of the exposure device 14. For example, where the substrate inlet 14a and the substrate outlet 14b of the exposure device 14 are not positioned opposite to the substrate platforms PASS9, PASS10, the securing base 21 may be made movable.

Figure 13:
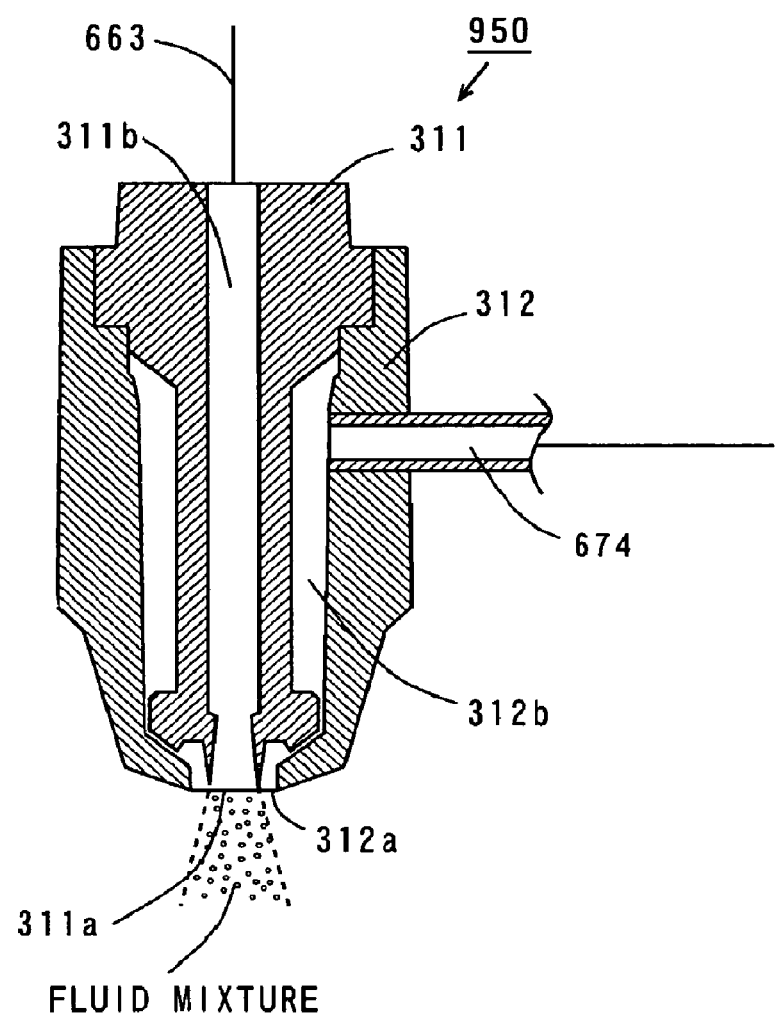
FIG. 13 is a longitudinal cross section showing an example of the internal structure of a two-fluid nozzle for use in washing and drying processings.

Furthermore, a two-fluid nozzle shown in FIG. 13 may also be used in the washing processing unit SOAK, instead of one or both the nozzle 650 for washing processing and the nozzle 670 for drying processing shown in FIG. 4.

FIG. 13 is a longitudinal cross section showing an example of the internal structure of the two-fluid nozzle 950 for use in washing and drying processings. The two-fluid nozzle 950 is capable of selectively discharging a gas, a liquid, and a fluid mixture of the gas and liquid.

The two-fluid nozzle 950 in this embodiment is so-called an external-mix type. The external-mix type two-fluid nozzle 950 shown in FIG. 13 comprises an inner body portion 311 and an outer body portion 312. The inner body portion 311 is composed of, e.g., quartz, and the outer body portion 312 is composed of a fluororesin such as PTFE (polytetrafluoroethylene).

A cylindrical liquid passage 311b is formed along the central axis of the inner body portion 311. The liquid passage 311b is provided with the supply pipe 663 shown in FIG. 4 for washing processing. Washing liquid or rinse liquid supplied from the supply pipe 663 is thus introduced into the liquid passage 311b.

A liquid discharge port 311a that communicates with the liquid passage 311b is formed at a lower end of the inner body portion 311. The inner body portion 311 is inserted into the outer body portion 312. Upper ends of the inner body portion 311 and the outer body portion 312 are joined together, while lower ends thereof are not joined.

A cylindrical gas passage 312b is formed between the inner body portion 311 and the outer body portion 312. A gas discharge port 312a that communicates with the gas passage 312b is formed at the lower end of the outer body portion 312. The supply pipe 674 shown in FIG. 4 for drying processing is mounted to a peripheral wall of the outer body portion 312, so as to communicate with the gas passage 312b. An inert gas supplied from the supply pipe 674 is thus introduced into the gas passage 312b.

The diameter of the gas passage 312 decreases downward in the vicinity of the gas discharge port 312a. As a result, the velocity of flow of the inert gas is accelerated, and the inert gas is discharged from the gas discharge port 312a.

The washing liquid discharged from the liquid discharge port 311a and the inert gas discharged from the gas discharge port 312a are mixed outside near the lower end of the two-fluid nozzle 950 to generate a mist-like fluid mixture that contains fine droplets of the washing liquid.

Figure 14:
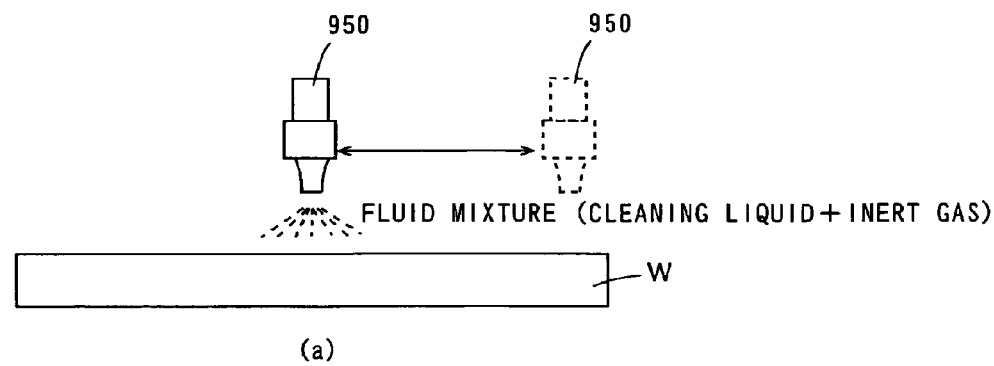
FIGS. 14 (a), 14 (b), and 14 (c) are diagrams for use in illustrating a method of applying drying processing to the substrate using the two-fluid nozzle in FIG. 13.
Figure 14:
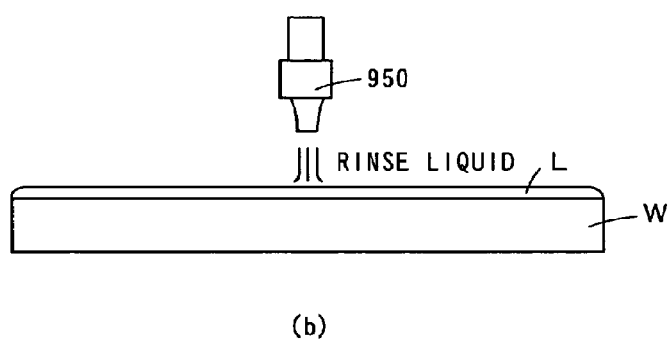
Figure 14:
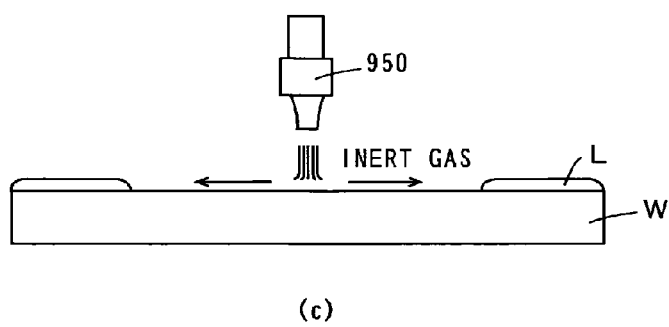

FIGS. 14 (a), 14 (b), 14 (c) are diagrams for use in illustrating a method of applying drying processing to the substrate W using the two-fluid nozzle 950 in FIG. 13.

The substrate W is initially held on the spin chuck 621 by suction, as shown in FIG. 4, and rotates together with the rotation of the rotation shaft 625. The rotation speed of the rotation shaft 625 is, e.g., about 500 rpm.

In this state, as shown in FIG. 14 (a), the two-fluid nozzle 950 discharges the mist-like fluid mixture of the washing liquid and the inert gas onto the top surface of the substrate W while gradually moving from above the center of the substrate W to above the peripheral portion thereof. In this way, the fluid mixture is sprayed onto the entire surface of the substrate W from the two-fluid nozzle 950 to clean the substrate W.

Next, the supply of the fluid mixture is stopped, and the rotation speed of the rotation shaft 625 decreases while the rinse liquid is discharged from the two-fluid nozzle 960 onto the substrate W, as shown in FIG. 14 (b). The rotation speed of the rotation shaft 625 is, e.g., about 10 rpm. A liquid layer L of the rinse liquid is thus formed on the entire surface of the substrate W. Alternatively, the rotation of the rotation shaft 625 may be stopped to form the liquid layer L on the entire surface of the substrate W. When pure water is used as the washing liquid in the fluid mixture for washing the substrate W, the supply of the rinse liquid may be omitted.

After the formation of the liquid layer L, the supply of the rinse liquid is stopped. Then, the inert gas is discharged onto the substrate W from the two-fluid nozzle 950, as shown in FIG. 14 (c). This causes the washing liquid on the center of the substrate W to move to the peripheral portion of the substrate W, leaving the liquid layer L only on the peripheral portion.

Then, the rotation speed of the rotation shaft 625 increases. The rotation speed of the rotation shaft 625 is, e.g., about 100 rpm. This causes a great centrifugal force acting on the liquid layer L on the substrate W, allowing the removal of the liquid layer L on the substrate W. As a result, the substrate W is dried.

The two-fluid nozzle 950 may gradually move from above the center of the substrate W to above the peripheral portion thereof when removing the liquid layer L on the substrate W. This allows the inert gas to be sprayed to the entire surface of the substrate W, which ensures the removal of the liquid layer L on the substrate W. As a result, the substrate W can be reliably dried.

As described above, the fluid mixture discharged from the two-fluid nozzle 950 contains fine droplets of the washing liquid. Therefore, even if the surface of the substrate W has irregularities, any contaminants attached on the surface of the substrate W can be stripped off. The contaminants on the surface of the substrate W can thus be reliably removed. Moreover, even if the films on the substrate W have low wettability, the fine droplets of the washing liquid strip off the contaminants on the surface of the substrate W, so that the contaminants can be reliably removed from the surface of the substrate W.

As a result, even if the solvent or the like in a resist is sublimated in the thermal processing units PHP or in the hotplates HP and the sublimates are attached to the substrate W again when thermal processing is applied to the substrate W by the thermal processing units PHP or the hotplates HP before exposure processing, the sublimates attached to the substrate W can be reliably removed by the washing processing units SOAK. It is therefore possible to reliably prevent the contamination inside the exposure device.

In addition, adjusting the flow rate of the inert gas allows adjustments to be easily made to the detergency in washing the substrate W. Thus, when the organic films (i.e., a resist film) on the substrate W are prone to damage, damage to the organic films on the substrate W can be prevented by weakening the detergency. Tough contaminants on the surface of the substrate W can also be removed reliably by strengthening the detergency. By adjusting the detergency in this way according to the properties of the organic films on the substrate W and the degree of contamination, it is possible to prevent damage to the organic films on the substrate W while washing the substrate W reliably.

Moreover, the external-mix type two-fluid nozzle 950 generates the fluid mixture by mixing the washing liquid and the inert gas outside the two-fluid nozzle 950. The inert gas and the washing liquid flow through the separate flow passages, respectively, in the two-fluid nozzle 950. This prevents the washing liquid from remaining in the gas passage 312b, allowing the inert gas to be discharged independently from the two-fluid nozzle 950. Also, the rinse liquid can be discharged independently from the two-fluid nozzle 950 by supplying the rinse liquid from the supply pipe 663. This allows the fluid mixture, the inert gas, and the rinse liquid to be selectively discharged from the two-fluid nozzle 950.

Furthermore, the use of the two-fluid nozzle 950 obviates the need to provide nozzles for supplying the washing liquid or the rinse liquid to the substrate W and for supplying the inert gas to the substrate W separately. This provides reliable washing and drying of the substrate W with a simple structure.

Although, in this embodiment, the two-fluid nozzle 950 is used to supply the rinse liquid to the substrate W, a separate nozzle may also be used for supplying the rinse liquid to the substrate W.

Moreover, in this embodiment, although the two-fluid nozzle 950 is used to supply the inert gas to the substrate W when removing the liquid layer L on the substrate W, a separate nozzle may also be used for supplying the inert gas to the substrate W.

In this embodiment, the anti-reflection film processing block 10, the resist film processing block 11, and the development 20 processing block 12 correspond to a processing section; the interface block 13 corresponds to an interface; the coating units RES correspond to a first processing unit; the washing processing units SOAK, SOAKa correspond to a second processing unit; the edge exposure units EEW correspond to a third processing unit; the substrate platforms PASS9, PASS10 correspond to a platform; the fourth central robot CR4 corresponds to a first transport unit; and the interface transport mechanism IFR corresponds to a second transport unit.

The hand CRH7 corresponds to a first holder; the hand CRH8 corresponds to a second holder; the hand H5 corresponds to a third holder; and the hand H6 corresponds to a fourth holder.

The spin chuck 621 corresponds to a substrate holding device; the rotation shaft 625 and the chuck rotation-drive mechanism 636 correspond to a rotation-drive device; the nozzle 650 for washing processing corresponds to a washing liquid supplier and a rinse liquid supplier; and the nozzles 670, 770, 870 for drying processing correspond to an inert gas supplier.

The two-fluid nozzle 950 corresponds to a fluid nozzle; the liquid passage 311b corresponds to a liquid flow passage; and the gas passage 312b corresponds to a gas flow passage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate processing method for processing a substrate in a substrate processing apparatus that is arranged adjacent to an exposure device that applies exposure processing to the substrate by a liquid immersion method, and comprises a first processing unit and a second processing unit, comprising the steps of:
applying a resist liquid to the substrate by said first processing unit to form a resist film on one surface of the substrate;
transporting the substrate, on which the resist film is formed by said first processing unit, to said second processing unit before the exposure processing by said exposure device;
washing the resist film formed on the one surface of the substrate by said first processing unit, by using a washing liquid by said second processing unit before the exposure processing by said exposure device; and
transporting the substrate washed by said second processing unit to said exposure device.

2. The substrate processing method according to claim 1, wherein
said step of washing the resist film includes the step of:
supplying the washing liquid to the resist film formed on the one surface of the substrate by said first processing unit.

3. The substrate processing method according to claim 1, wherein
said step of washing the resist film includes the steps of:
rotating the substrate, on which the resist film is formed by said first processing unit, about a vertical axis while holding the substrate substantially horizontally, and
supplying the washing liquid onto the resist film on the substrate being rotated.

4. The substrate processing method according to claim 1, further comprising the step of drying the substrate by said second processing unit after washing the resist film by said second processing unit and before transporting the substrate to said exposure device.

5. The substrate processing method according to claim 4, wherein
said step of drying the substrate includes the step of supplying an inert gas onto the substrate supplied with the washing liquid.

6. The substrate processing method according to claim 5, wherein
said step of supplying the inert gas includes the steps of:
rotating the substrate supplied with the washing liquid about a vertical axis while holding the substrate substantially horizontally, and
supplying the inert gas onto the substrate being rotated.

7. The substrate processing method according to claim 6, wherein
said step of supplying the inert gas includes the step of supplying the inert gas so that the washing liquid supplied onto the substrate is removed from the substrate as the washing liquid moves outwardly from the center of the substrate.

8. The substrate processing method according to claim 4, wherein
said step of supplying the washing liquid includes the step of supplying a fluid mixture containing a washing liquid and a gas onto the substrate from a fluid nozzle of said second processing unit.

9. The substrate processing method according to claim 8, wherein
said step of drying the substrate includes the step of supplying the inert gas onto the substrate from said fluid nozzle.

10. The substrate processing method according to claim 5, wherein
said step of drying the substrate further includes the step of supplying a rinse liquid onto the substrate after the supply of the washing liquid and before the supply of the inert gas.

11. The substrate processing method according to claim 10, wherein
said step of supplying the inert gas includes the step of supplying the inert gas so that the rise liquid supplied onto the substrate is removed from the substrate as the rinse liquid moves outwardly from the center of the substrate.

12. The substrate processing method according to claim 1, wherein
said substrate processing apparatus further includes a first transport unit having first and second holders, and
said method further comprises the step of transporting the substrate from said exposure device, and wherein
said step of transporting the substrate to said exposure device includes the step of holding and transporting the substrate with said first holder of said first transport unit to said exposure device, and said step of transporting the substrate from said exposure device includes the step of holding and transporting the substrate from said exposure device with said second holder of said first transport unit.

13. The substrate processing method according to claim 12, wherein
said step of holding and transporting the substrate from said exposure device with said second holder includes the step of holding and transporting the substrate with said second holder that is provided below said first holder.

14. The substrate processing method according to claim 12, wherein
said substrate processing apparatus further includes a third processing unit, a second transport unit having third and fourth holders, and a first platform, and
said method further comprises the steps of:
holding and transporting the substrate, on which the resist film is formed, with said third holder of said second transport unit to said third processing unit,
applying given processing to the substrate before the exposure processing, which is transported by said second transport unit, by said third processing unit, and
holding and transporting the substrate after the exposure processing, which is mounted on said first platform, with said fourth holder of said second transport unit, and wherein
said step of transporting the substrate to said second processing unit includes the step of holding and transporting the substrate processed by said third processing unit with said first holder of said first transport unit to said second processing unit,
said step of holding and transporting the substrate with said first holder of said first transport unit to said exposure device includes the step of holding and transporting the substrate with said first holder from said second processing unit to said exposure device, and
said step of holding and transporting the substrate from said exposure device with said second holder includes the step of holding and transporting the substrate from said exposure device with said second holder of said first transport unit to said first platform.

15. The substrate processing method according to claim 14, wherein
said step of transporting the substrate after the exposure processing by said fourth holder of said second transport unit includes the step of holding and transporting the substrate after the exposure processing, which is mounted on said platform, with said fourth holder that is provided below said third holder.

16. The substrate processing method according to claim 15, wherein
said step of applying given processing to the substrate by said third processing unit includes the step of subjecting a peripheral portion of the substrate to exposure by said third processing unit.

17. The substrate processing method according to claim 14, wherein
said substrate processing apparatus further includes a second platform, and
said method further comprises the step of holding and transporting the substrate processed by said third processing unit with said third holder of said second transport unit from said third processing unit to said second platform, and wherein
said step of holding and transporting the substrate processed by said third processing unit with said first holder to said second processing unit includes the step of holding and transporting the substrate mounted on said second platform with said first holder of said first transport unit to said second processing unit.

* * * * *